US012622330B2

(12) United States Patent
Baek et al.

(10) Patent No.: US 12,622,330 B2
(45) Date of Patent: May 5, 2026

(54) STACKED SEMICONDUCTOR PACKAGE

(71) Applicant: Samsung Electronics Co., Ltd.,
Suwon-si (KR)

(72) Inventors: Joonghyun Baek, Suwon-si (KR);
Jaekyu Sung, Suwon-si (KR); **Dongok
Kwak, Suwon-si (KR); Taeyoung Lee**,
Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 407 days.

(21) Appl. No.: 18/334,062

(22) Filed: Jun. 13, 2023

(65) Prior Publication Data

US 2024/0079380 A1     Mar. 7, 2024

(30) Foreign Application Priority Data

Sep. 1, 2022     (KR) ........................ 10-2022-0111015

(51) Int. Cl.
H01L 25/065          (2023.01)
H01L 23/00           (2006.01)
(52) U.S. Cl.
CPC .......... H01L 25/0657 (2013.01); H01L 24/32
(2013.01); H01L 24/48 (2013.01); H01L 24/73
(2013.01); H01L 25/0652 (2013.01); *H01L*
*2224/32145* (2013.01); *H01L 2224/48147*
(2013.01); *H01L 2224/48227* (2013.01); *H01L*
*2224/73215* (2013.01);
(Continued)
(58) Field of Classification Search
CPC . H10B 80/00; H01L 25/0657; H01L 25/0652;

H01L 25/18; H01L 24/32; H01L 24/48;
H01L 24/73; H01L 2225/06506; H01L
2225/0651; H01L 2225/06562; H01L
2225/06517; H01L 2225/06527; H01L
2225/06586
USPC ................................................. 257/668, 686
See application file for complete search history.

(56) References Cited

U.S. PATENT DOCUMENTS 9,184,156 B2    11/2015  Kim et al.
9,412,720 B2     8/2016  Nam et al.
9,947,644 B2     4/2018  Hong et al.
(Continued)

FOREIGN PATENT DOCUMENTS

KR        2014/0027801 A      3/2014

*Primary Examiner* — Jasmine J Clark
(74) *Attorney, Agent, or Firm* — HARNESS, DICKEY &
PIERCE, P.L.C.

(57)            ABSTRACT
A stacked semiconductor package may include a package
base substrate, a first chip stack including a first semicon-
ductor chips stacked sequentially on the package base sub-
strate, a second chip stack including second semiconductor
chips stacked sequentially on the first chip stack, and bond-
ing wires electrically connecting the first semiconductor
chips and the second semiconductor chips to the package
base substrate. Each of the first semiconductor chips may be
shifted by a first interval in a first horizontal direction to
have a step shape. Each of the second semiconductor chips
may be shifted by the first interval in a second horizontal
direction, opposite to the first horizontal direction, to have a
step shape. A lowermost second semiconductor chip may be
shifted from an uppermost first semiconductor chip by a
second interval in the second direction. The second interval
may be greater than the first interval.

20 Claims, 17 Drawing Sheets

1

(52) U.S. Cl.
     CPC ............... *H01L 2225/06506* (2013.01); *H01L*
                  *2225/0651* (2013.01); *H01L 2225/06562*
                                              (2013.01)

(56)                References Cited

U.S. PATENT DOCUMENTS

| | | | |
|---|---|---|---|
| 9,953,965 | B2 | 4/2018 | Park et al. |
| 10,998,294 | B2 | 5/2021 | Kang |
| 2010/0314740 | A1 | 12/2010 | Choi et al. |
| 2017/0170156 | A1* | 6/2017 | Hong ...................... H01L 25/18 |
| 2020/0105734 | A1* | 4/2020 | Akada ..................... H01L 24/48 |

* cited by examiner

STACKED SEMICONDUCTOR PACKAGE

CROSS-REFERENCE TO RELATED APPLICATION

This application is based on and claims priority under 35 U.S.C. § 119 to Korean Patent Application No. 10-2022-0111015, filed on Sep. 1, 2022, in the Korean Intellectual Property Office, the disclosure of which is incorporated by reference herein in its entirety.

BACKGROUND

Inventive concepts relate to a semiconductor package, and more particularly, to a stacked semiconductor package including a plurality of stacked semiconductor chips.

In accordance with the rapid development of the electronics industry and users' request, electronic devices have been increasingly reduced in size and weight. Accordingly, high integration and high capacity of semiconductor devices, which are core components of electronic devices, have been required, but there is a limit of high integration of semiconductor devices. Accordingly, a semiconductor package including a plurality of semiconductor chips has been developed in order to achieve a large capacity.

In addition, as demand for semiconductor devices having large capacity has increased, a stacked semiconductor package in which a plurality of semiconductor chips included in a semiconductor package is stacked has been developed.

SUMMARY

Inventive concepts provide a stacked semiconductor package including a plurality of stacked semiconductor chips having structural reliability.

According to an embodiment of inventive concepts, a stacked semiconductor package may include a package base substrate; a first chip stack including a plurality of first semiconductor chips stacked sequentially on the package base substrate, each of the plurality of first semiconductor chips being shifted by a first interval in a first horizontal direction to have a step shape; a second chip stack including a plurality of second semiconductor chips stacked sequentially on the first chip stack, each of the plurality of second semiconductor chips being shifted by the first interval in a second horizontal direction to have a step shape, the second direction being opposite the first horizontal direction; and a plurality of bonding wires electrically connecting the plurality of first semiconductor chips and the plurality of second semiconductor chips to the package base substrate. An upper support semiconductor chip may be a lowermost second semiconductor chip among the plurality of second semiconductor chips. A lower support semiconductor chip may be an uppermost first semiconductor chip among the plurality of first semiconductor chips. The upper support semiconductor chip may be shifted from the lower support semiconductor chip by a second interval in the second horizontal direction. The second interval may be greater than the first interval.

According to an embodiment of inventive concepts, a stacked semiconductor package may include a package base substrate; a first chip stack including a plurality of first semiconductor chips stacked sequentially on the package base substrate, each of the plurality of first semiconductor chips being shifted by a first interval in a first horizontal direction to have a step shape, and each of the plurality of first semiconductor chips having a first length in the first horizontal direction; a controller chip adhered to the package base substrate, the controller chip being apart from the first chip stack in the first horizontal direction; and a second chip stack including a plurality of second semiconductor chips stacked sequentially on the first chip stack, each of the plurality of second semiconductor chips being shifted by the first interval in a second horizontal direction to have a step shape, each of the plurality of second semiconductor chips having the first length in the first horizontal direction, the second horizontal direction being opposite the first horizontal direction, and the second chip stack overlapping at least a portion of the controller chip. A lowermost second semiconductor chip, among the plurality of second semiconductor chips, may be shifted by a second interval in the second horizontal direction compared to an uppermost first semiconductor chip among the plurality of first semiconductor chips. The second interval may be greater than the first interval. An uppermost second semiconductor chip, among the plurality of second semiconductor chips, may be shifted by a second length in the second horizontal direction compared to a lowermost first semiconductor chip among the plurality of first semiconductor chips. The second length may be less than the first length.

According to an embodiment of inventive concepts, a stacked semiconductor package may include a package base substrate; a first chip stack including a plurality of first semiconductor chips stacked sequentially on the package base substrate, each of the plurality of first semiconductor chips being shifted by a first interval in a first horizontal direction to have a step shape; a controller chip adhered to the package base substrate, the controller chip being apart from the first chip stack in the first horizontal direction; a second chip stack including a plurality of second semiconductor chips stacked sequentially on the first chip stack, each of the plurality of second semiconductor chips being shifted by the first interval in a second horizontal direction to have a step shape, the second direction being opposite the first horizontal direction, the second chip stack overlapping at least a portion of the controller chip; a connection structure adhered to a portion of an upper surface of an uppermost first semiconductor chip among the plurality of first semiconductor chips, the connection structure electrically connecting the plurality of second semiconductor chips to the package base substrate; and a plurality of bonding wires electrically connecting the plurality of first semiconductor chips and the plurality of second semiconductor chips to the package base substrate. A lowermost second semiconductor chip, among the plurality of second semiconductor chips, may not be adhered to the portion of the upper surface of the uppermost first semiconductor chip. The lowermost second semiconductor chip may be shifted by a second interval in the second horizontal direction compared to an uppermost first semiconductor chip, among the plurality of first semiconductor chips. The second interval may be greater than the first interval. The plurality of first semiconductor chips may include the uppermost first semiconductor chip and other first semiconductor chips. The plurality of second semiconductor chips may include the uppermost first semiconductor chip and other first semiconductor chips. The other first semiconductor chips each may have a first thickness. The uppermost first semiconductor chip may have a second thickness. The second thickness may be greater than the first thickness. The lowermost second semiconductor chip may have a third thickness. The third thickness may be greater than the first thickness and equal to or greater than the second thickness.

BRIEF DESCRIPTION OF THE DRAWINGS

Embodiments of inventive concepts will be more clearly understood from the following detailed description taken in conjunction with the accompanying drawings in which:

FIGS. 1A and 1B are a cross-sectional view and a plan layout view illustrating a stacked semiconductor package according to an embodiment;

FIGS. 3A and 3B are a cross-sectional view and a plan layout view illustrating a stacked semiconductor package according to an embodiment;

FIGS. 4A and 4B are a cross-sectional view and a plan layout view of a stacked semiconductor package according to an embodiment;

FIGS. 7A to 7E are cross-sectional views illustrating a method of manufacturing a stacked semiconductor package according to an embodiment.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1A:
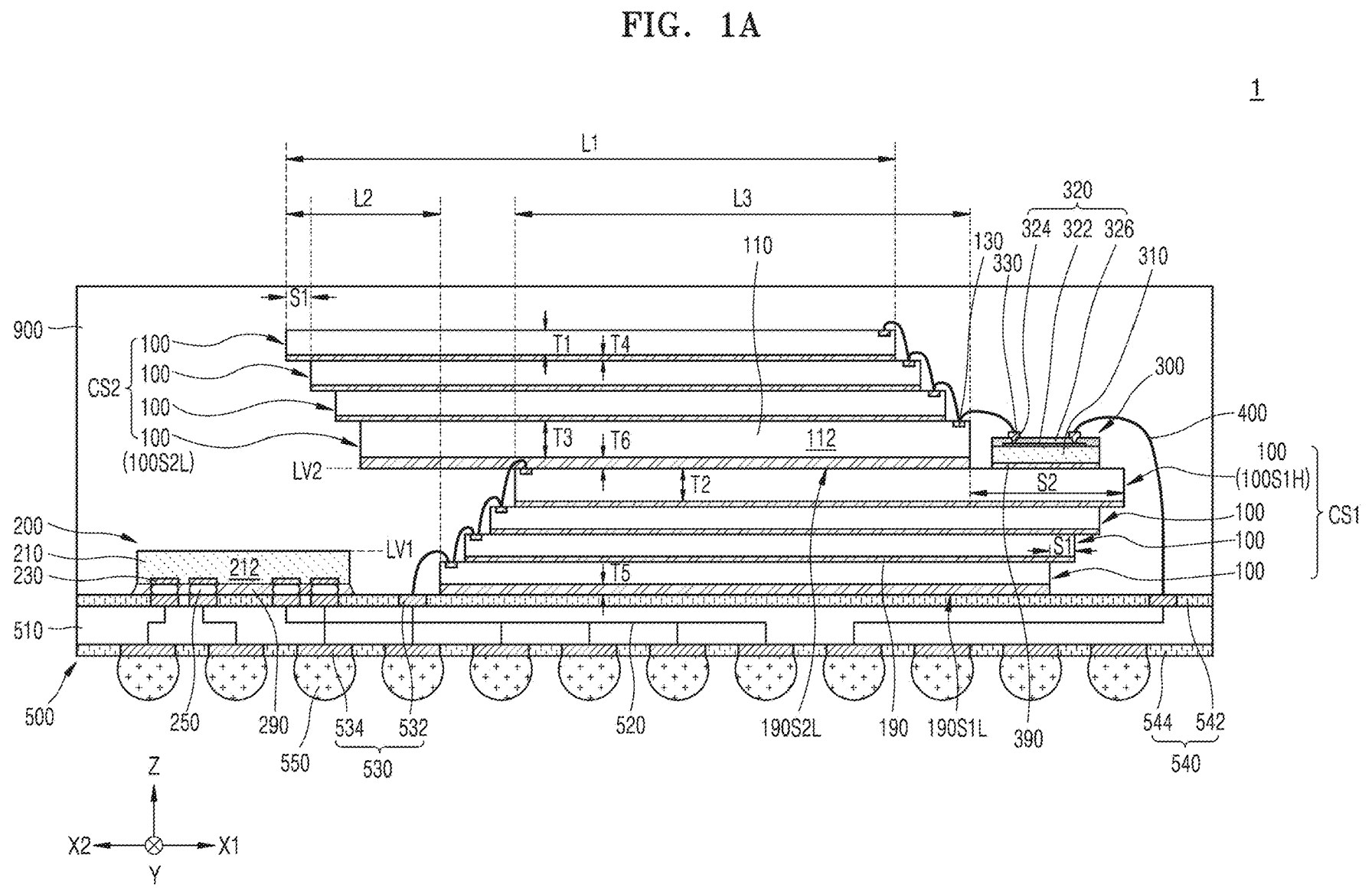
Figure 1B:
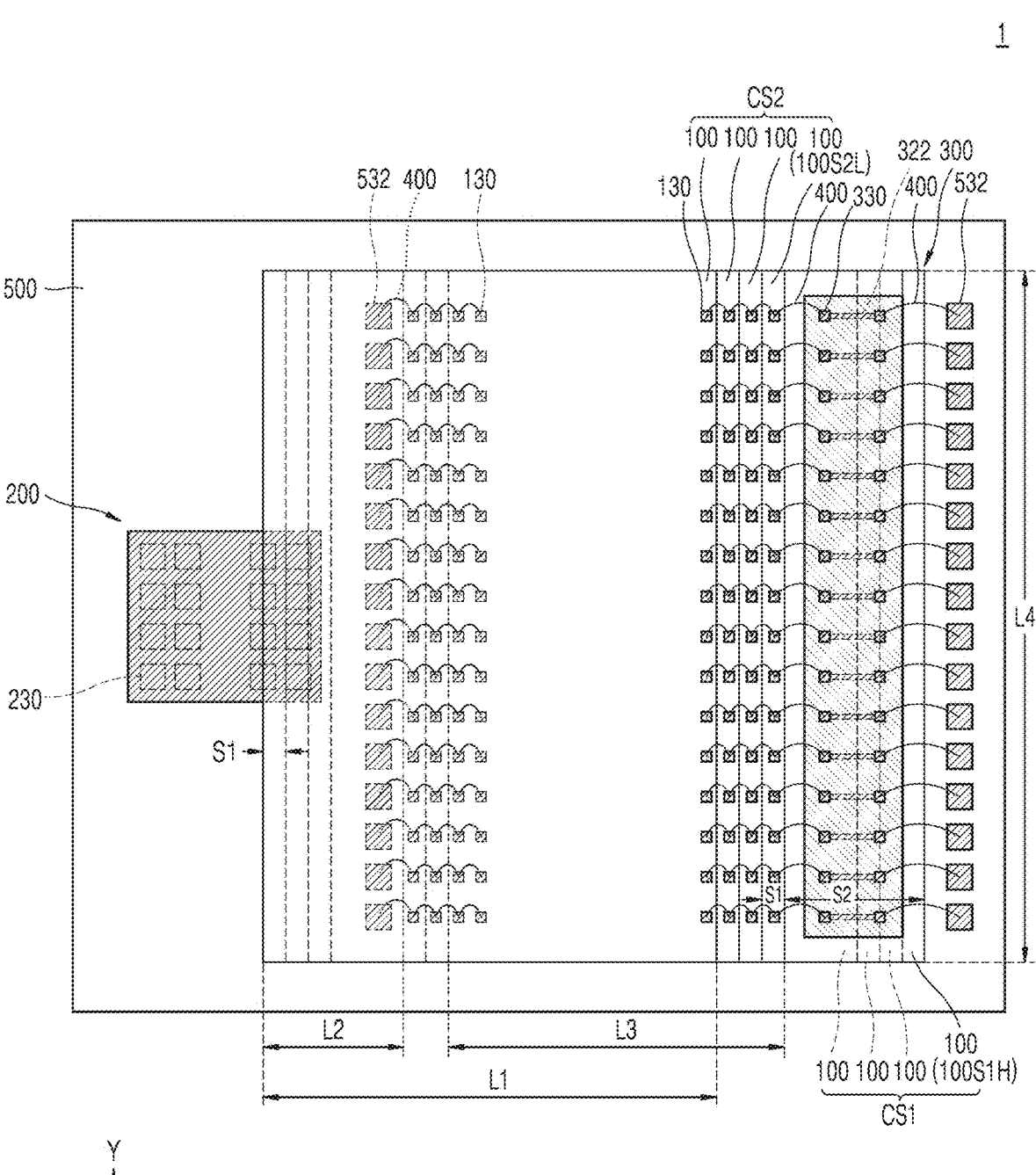

FIGS. 1A and 1B are a cross-sectional view and a plan layout view illustrating a stacked semiconductor package 1 according to an embodiment.

Referring to FIGS. 1A and 1B together, the stacked semiconductor package 1 includes a package base substrate 500 and a plurality of semiconductor chips 100.

The package base substrate 500 may include, for example, a printed circuit board (PCB). For example, the package base substrate 500 may include a double-sided PCB. For example, the package base substrate 500 may be a multi-layer PCB. When the package base substrate 500 is a multi-layer PCB, wiring layers may be respectively disposed on a lower surface, an upper surface, and an inside of the package base substrate 500.

The package base substrate 500 may include a base layer 510 and a plurality of connection pads 530 disposed on upper and lower surfaces of the base layer 510. In some embodiments, the base layer 510 may include a plurality of stacked sub-base layers.

The connection pads 530 may include a plurality of upper connection pads 532 disposed on the upper surface of the package base substrate 500 and a plurality of lower connection pads 534 disposed on the lower surface of the package base substrate 500. For example, the upper connection pads 532 may be disposed on an upper surface of the base layer 510, and the lower connection pads 534 may be disposed on the lower surface of the base layer 510.

In some embodiments, the upper connection pads 532 and the lower connection pads 534 may protrude from the base layer 510. For example, the upper connection pads 532 may protrude upward from the upper surface of the base layer 510, and the lower connection pads 534 may protrude downward from the lower surface of the base layer 510.

In some other embodiments, the upper connection pads 532 and the lower connection pads 534 may be embedded in the base layer 510, so that an upper surface of the upper connection pads 532 may be coplanar with the upper surface of the base layer 510, and a lower surface of the lower connection pads 532 may be coplanar with the lower surface of the base layer 510.

The solder resist layer 540 may cover the upper and lower surfaces of the base layer 510. The solder resist layer 540 may include an upper solder resist layer 542 covering the upper surface of the base layer 510 and a lower solder resist layer 544 covering the lower surface of the base layer 510. At least a portion of each of the upper connection pads 532 may not be covered by the upper solder resist layer 542 and may be exposed to the upper surface of the package base substrate 500. At least a portion of each of the lower connection pads 534 may not be covered by the lower solder resist layer 544 and may be exposed to the lower surface of the package base substrate 500. In some embodiments, a portion adjacent to the edge of each of the upper connection pads 532 and the lower connection pads 534 may be covered by the upper solder resist layer 542 and the lower solder resist layer 544, and the rest may not be covered and exposed.

In some embodiments, the package base substrate 500 may not include at least one of the upper solder resist layer 542 and the lower solder resist layer 544. For example, the package base substrate 500 may include the lower solder resist layer 544 but not the upper solder resist layer 542.

A plurality of bonding wires 400 and a plurality of chip connection terminals 250 may be connected to the upper connection pads 532. For example, the bonding wires 400 may be connected to some of the upper connection pads 532, and the chip connection terminals 250 may be adhered to some other ones of the upper connection pads 532.

A plurality of external connection terminals 550 may be adhered to the lower connection pads 534, respectively. The external connection terminals 550 may be, for example, solder balls or bumps. The external connection terminals 550 may electrically connect the stacked semiconductor package 1 to an electronic device.

In some embodiments, the base layer 510 may include at least one material selected from a phenol resin, an epoxy resin, and a polyimide. For example, the base layer 510 may include at least one material selected from flame retardant 4 (FR4), tetrafunctional epoxy, polyphenylene ether, epoxy/polyphenylene oxide, bismaleimide triazine (BT), thermount, cyanate ester, polyimide, and a liquid crystal polymer.

A plurality of connection conductive layers 520 connecting the upper connection pads 532 to the lower connection pads 534 may be located in the package base substrate 500. The connection conductive layers 520 may include connection wiring lines disposed on upper and lower surfaces of the base layer 510 or between the sub-base layers and connection conductive vias connecting at least two of the upper connection pads 532, the lower connection pads 534, and the connection wiring lines located on different vertical levels through at least a portion of the base layer 510. Although it is illustrated that the connection conductive layers 520 are located only inside the base layer 510 in FIG. 1A, inventive concepts are not limited thereto. For example, a portion of the connection conductive layers 520, e.g., a portion of the connection wiring lines, may extend along the upper surface or the lower surface of the base layer 510.

Each of the connection wiring lines may extend in a first horizontal direction (an X1 direction), a second horizontal direction (an X2 direction), a third horizontal direction (a Y direction), an oblique direction with respect to the first horizontal direction (the X1 direction) and the third horizontal direction (the Y direction), or an oblique direction with respect to the second horizontal direction (the X2 direction) and the third horizontal direction (the Y direction). The connection conductive vias may extend in a vertical direction (a Z direction). The first horizontal direction (the X1 direction) may be orthogonal to the third horizontal direction (the Y direction). The second horizontal direction (the X2 direction) and the third horizontal direction (the Y direction) may be orthogonal to each other. The first horizontal direction (the X1 direction) may be opposite to the second horizontal direction (the X2 direction). The vertical direction (the Z direction) may be orthogonal to each of the first horizontal direction (the X1 direction), the second horizontal direction (the X2 direction), and the third horizontal direction (the Y direction). In some embodiments, the first horizontal direction (the X1 direction), the third horizontal direction (the Y direction), and the vertical direction (the Z direction) may be an X direction, a Y direction, and a Z direction in an XYZ coordinate system. For example, in the XYZ coordinate system, the first horizontal direction (the X1 direction) may be a +X direction, and the second horizontal direction (the X2 direction) may be a −X direction.

The connection wiring lines, among the upper connection pads 532, the lower connection pads 532, and the connection conductive layers 520 may include, for example, electrolytically deposited (ED) copper foils, rolled-annealed (RA) copper foils, stainless steel foils, aluminum foils, ultra-thin copper foils, sputtered copper, copper alloys, and the like. The connection conductive vias among the connection conductive layers 520 may include, for example, copper, nickel, stainless steel, or beryllium copper. The connection wiring lines may constitute a wiring layer.

The semiconductor chips 100 may be sequentially stacked on the package base substrate 500 in a vertical direction (the Z direction). The semiconductor chips 100 may be stacked in a step shape at intervals in the first horizontal direction (the X1 direction) or the second horizontal direction (the X2 direction). Some of the semiconductor chips 100 may form a first chip stack CS1, and some other ones of the semiconductor chips 100 may form the second chip stack CS2. The first chip stack CS1 may be adhered on the package base substrate 500, and the second chip stack CS2 may be adhered on the first chip stack CS1. Each of the semiconductor chips 100 included in the first chip stack CS1 may be referred to as a first semiconductor chip, and each of the semiconductor chips 100 included in the second chip stack CS2 may be referred to as a second semiconductor chip. When the semiconductor chip 100 included in the first chip stack CS1 and the semiconductor chip 100 included in the second chip stack CS2 are separately described, the semiconductor chip 100 included in the first chip stack CS1 and the semiconductor chip 100 included in the second chip stack CS2 may be referred to as the first semiconductor chip and the second semiconductor chip, respectively, and when the semiconductor chip 100 included in the first chip stack CS1 and the semiconductor chip 100 included in the second chip stack CS2 are described without distinguishing therebetween, the semiconductor chip 100 included in the first chip stack CS1 and the semiconductor chip 100 included in the second chip stack CS2 may be referred to as the semiconductor chips 100.

The semiconductor chips 100 included in the first chip stack CS1 may be stacked in a step shape with a substantially constant interval, for example, a first interval S1, in the first horizontal direction (the X1 direction). The semiconductor chips 100 included in the second chip stack CS2 may be stacked in a step shape with a substantially constant interval, for example, the first interval S1 in a direction opposite to the first horizontal direction (the X1 direction), that is, the second horizontal direction (the X2 direction). The semiconductor chips 100 included in the first chip stack CS1 may be shifted by the first interval S1 in the first horizontal direction (the X1 direction) from the lower semiconductor chip 100, to be stacked on the lower semiconductor chip 100. The semiconductor chips 100 included in the second chip stack CS2 may be shifted by the first interval S1 in the second horizontal direction (the X2 direction) from the lower semiconductor chip 100, to be stacked on the lower semiconductor chip 100. For example, when each of the first chip stack CS1 and the second chip stack CS2 includes four semiconductor chips 100, the uppermost semiconductor chip 100 of the first chip stack CS1 may be shifted by three times the first interval S1 in the first horizontal direction (the X1 direction) from the lowermost semiconductor chip 100 and the uppermost semiconductor chip 100 of the second chip stack CS2 may be shifted by three times the first interval S1 in the second horizontal direction (the X2 direction) from the lowermost semiconductor chip 100.

The lowermost semiconductor chip 100 of the second chip stack CS2, among the semiconductor chips 100, may be shifted by the second interval S2 in the second horizontal direction (the X2 direction) from the uppermost semiconductor chip 100 of the first chip stack CS1, to be stacked on the uppermost semiconductor chip 100 of the first chip stack CS1, among the semiconductor chips 100. The second interval S2 may have a greater value than the first interval S1. The uppermost semiconductor chip 100 of the first chip stack CS1 may be referred to as a lower support semiconductor chip 100S1H, and the lowermost semiconductor chip 100 of the second chip stack CS2 may be referred to as an upper support semiconductor chip 100S2L. The lower support semiconductor chip 100S1H may support the second chip stack CS2 stacked on the upper side, and the upper support semiconductor chip 100S2L may support the other semiconductor chips 100 included in the second chip stack CS2.

A connection structure 300 may be adhered to a portion of an upper surface of the uppermost semiconductor chip 100, e.g., the lower support semiconductor chip 100S1H, of the first chip stack CS1, e.g., a portion to which the upper support semiconductor chip 100S2L is not adhered. The connection structure 300 may be adhered to the lower support semiconductor chip 100S1H with a die adhesive film 390 therebetween. In some embodiments, the connection structure 300 may be an interposer. The connection structure 300 may include a connection base substrate 310, an intermediate connection structure 320 disposed on the connection base substrate 310, and a plurality of intermediate connection pads 330 disposed on the intermediate connection structure 320. The intermediate connection pads 330 may be disposed on an upper surface of the connection structure 300.

The connection base substrate 310 may include a semiconductor, glass, ceramic, or plastic. The connection base substrate 310 may include the same material as that of a semiconductor substrate 110. For example, the connection base substrate 310 may include silicon.

The intermediate connection structure 320 may be disposed on an upper surface of the connection base substrate 310. The intermediate connection structure 320 may include a plurality of intermediate connection lines 322, a plurality of intermediate connection vias 324, and an intermediate connection insulating layer 326. The intermediate connection insulating layer 326 may cover the upper surface of the connection base substrate 310 and surround the intermediate connection lines 322 and the intermediate connection vias 324. In some embodiments, the intermediate connection structure 320 may be formed by performing a redistribution process.

In some embodiments, the intermediate connection lines 322 may extend along the upper surface of the connection base substrate 310. For example, each of the intermediate connection lines 322 may extend in the first horizontal direction (the X1 direction).

The intermediate connection vias 324 may connect the intermediate connection lines 322 to the intermediate connection pads 330. For example, the intermediate connection via 324 may be connected to each of both ends of one intermediate connection line 322, among the intermediate connection lines 322. A pair of intermediate connection pads 330, among the intermediate connection pads 330, may be electrically connected to both ends of one intermediate connection line 322 through a pair of intermediate connection vias 324, respectively. That is, the pair of intermediate connection pads 330 corresponding to each other may be electrically connected to each other through one intermediate connection line 322 and a pair of intermediate connection vias 324 connected to both ends of the one intermediate connection line 322. Each of the pair of intermediate connection pads 330 electrically connected to each other through one intermediate connection line 322 may be referred to as a first intermediate connection pad and a second intermediate connection pad. The first intermediate connection pad and the second intermediate connection pad may be connected to one end and the other end of one intermediate connection line 322 through a pair of intermediate connection vias 324.

A thickness of some the first semiconductor chips included in the first chip stack CS1 and the second semiconductor chips included in the second chip stack CS2 may be different from thicknesses of the others. Except for the thickness difference, the first semiconductor chips included in the first chip stack CS1 and the second semiconductor chips included in the second chip stack CS2 may be substantially the same type of semiconductor chips. For example, each of the semiconductor chips 100, except for the lower support semiconductor chip 100S1H, among the semiconductor chips 100 included in the first chip stack CS1, and the semiconductor chips 100, except for the upper support semiconductor chip 100S2L, among the semiconductor chips 100 included in the second chip stack CS2, may have a first thickness T1, the lower support semiconductor chip 10051H may have a second thickness T2, and the upper support semiconductor chip 100S2L may have a third thickness T3. The second thickness T2 and the third thickness T3 may be greater than the first thickness T1. In some embodiments, the third thickness T3 may be equal to or greater than the second thickness T2. For example, the first thickness T1 may be about 40 μm to about 80 μm, the second thickness T2 may be about 60 μm to about 100 μm, and the third thickness T3 may be about 60 μm to about 150 μm.

The semiconductor chip 100 may include the semiconductor substrate 110. The semiconductor substrate 110 may include, for example, silicon (Si). Alternatively, the semiconductor substrate 110 may include a semiconductor element, such as germanium (Ge), or a compound semiconductor, such as silicon carbide (SiC), gallium arsenide (GaAs), indium arsenide (InAs), and indium phosphide (InP). Alternatively, the semiconductor substrate 110 may have a silicon on insulator (SOI) structure. For example, the semiconductor substrate 110 may include a buried oxide layer (BOX). The semiconductor substrate 110 may include a conductive region, for example, a well doped with impurities. The semiconductor substrate 110 may have various device isolation structures, such as a shallow trench isolation (STI) structure. The semiconductor substrate 110 may have an active surface and an inactive surface opposite to the active surface.

In the semiconductor chip 100, a semiconductor device 112 including a plurality of individual devices of various types may be formed on the active surface. The individual devices may include various microelectronic devices, for example, a metal-oxide-semiconductor field effect transistor (MOSFET), such as a complementary metal-insulator-semiconductor (CMOS) transistor, a system large scale integration (LSI), an image sensor, such as a CMOS imaging sensor (CIS), a micro-electro-mechanical system (MEMS), an active device, a passive device, and the like. The individual devices may be electrically connected to a conductive region of the semiconductor substrate 110. The semiconductor device 112 may further include at least two of the individual devices, or a conductive wire or a conductive plug electrically connecting the individual devices to the conductive region of the semiconductor substrate 110. In addition, each of the individual devices may be electrically isolated from other neighboring individual devices by an insulating layer.

The semiconductor device 112 may be a memory semiconductor device. For example, the semiconductor chip 100 may be a memory semiconductor chip. In some embodiments, the memory semiconductor device may include nonvolatile memory semiconductor device, such as flash memory, phase-change random access memory (PRAM), magnetoresistive random access memory (MRAM), ferroelectric random access memory (FeRAM), or resistive random access memory (RRAM). The flash memory may be, for example, a vertical NAND (V-NAND) flash memory. In other embodiments, the memory semiconductor device may include a volatile memory semiconductor chip, such as dynamic random access memory (DRAM) or static random access memory (SRAM).

Each of the semiconductor chips 100 may include a plurality of chip pads 130 disposed on an upper surface thereof. For example, the chip pads 130 may be disposed the active surfaces of the semiconductor chips 100, respectively. Each of the semiconductor chips 100 may be stacked on the package base substrate 500 such that the active surface faces upward, that is, in a direction opposite to the package base substrate 500. Each of the semiconductor chips 100 may be stacked on the package base substrate 500 such that the inactive surface of the semiconductor substrate 110 faces downward, that is, toward the package base substrate 500.

A plurality of bonding wires 400 may be adhered between the chip pads 130 and the upper connection pads 532. The semiconductor chip 100 may be electrically connected to the package base substrate 500 through the bonding wires 400.

Some of the bonding wires 400 may sequentially connect the chip pads 130 of each of the semiconductor chips 100 included in the first chip stack CS1, from the chip pads 130 of the uppermost semiconductor chip 100 of the first chip stack CS1 to the chip pads 130 of the lowermost semiconductor chip 100, and then connect the chip pads 130 of the lowermost semiconductor chip 100 of the first chip stack CS1 to some of the upper connection pads 532.

Some other ones of the bonding wires 400 may be sequentially connected to the chip pads 130 of each of the semiconductor chips 100 included in the second chip stack CS2 and to some the intermediate connection pads 330 of the connection structure 300, from the chip pads 130 of the uppermost semiconductor chip 100 of the second chip stack CS2 to the chip pads 130 of the lowermost semiconductor chip 100. Some other ones of the bonding wires 400 may connect some other ones of the intermediate connection pads 330 of the connection structure 300 to some other ones of the upper connection pads 532.

That is, the semiconductor chips 100 included in the first chip stack CS1 may be electrically connected to the package base substrate 500 through some the bonding wires 400, and the semiconductor chips 100 included in the second chip stack CS2 may be electrically connected to the connection package base substrate 500 through some other ones of the bonding wires 400, the connection structure 300, and some other ones of the bonding wires 400.

The semiconductor chips 100 may have a plurality of die adhesive films 190 adhered to a lower surface thereof, and may be adhered to a lower structure thereof. For example, the lowermost semiconductor chip 100, among the semiconductor chips 100, that is, the lowermost semiconductor chip 100 of the first chip stack CS1, may be adhered to the package base substrate 500 with the die adhesive film 190 therebetween, and each of the other semiconductor chips 100 may be adhered to another semiconductor chip 100 therebelow with the die adhesive film 190 therebetween. The die adhesive film 190 and the die adhesive film 390 may be referred to as a first die adhesive film 190 and a second die adhesive film 390, respectively.

The first die adhesive film 190 and the second die adhesive film 390 may include, for example, an inorganic adhesive or a polymer adhesive. The polymer adhesive may include, for example, a thermosetting resin or a thermoplastic resin. The thermosetting resin has a cross-link structure after monomers are heat-molded, and is not softened even when reheated. In contrast, the thermoplastic resin is a resin that exhibits plasticity by heating and has a structure of a linear polymer. In addition, the polymer adhesive may be of a hybrid type made by mixing these two components.

Among a plurality of first die adhesive films 190, the die adhesive film 190 adhered to a lower surface of the lowermost semiconductor chip 100 of the first chip stack CS1 may be referred to as a first lower adhesive film 190S1L, and the die adhesive film 190 adhered to a lower surface of the lowermost semiconductor chip 100 of the second chip stack CS2 may be referred to as a second lower adhesive film 190S2L.

A thickness of some the first die adhesive films 190 may be different from a thickness of the rest. Except for the difference in thickness, the first die adhesive films 190 may be substantially the same type of films. For example, each of the first die adhesive films 190 excluding the first lower adhesive film 190S1L and the second lower adhesive film 190S2L, among the first die adhesive films 190, may have a fourth thickness T4, the first lower adhesive film 190S1L may have a fifth thickness T5, and the second lower adhesive film 190S2L may have a sixth thickness T6. The fifth thickness T5 and the sixth thickness T6 may be greater than the fourth thickness T4. In some embodiments, the fifth thickness T5 and the sixth thickness T6 may be substantially the same. For example, the fourth thickness T4 may be about 15 μm to about 30 μm, and each of the fifth thickness T5 and the sixth thickness T6 may be about 35 μm to about 50 μm.

Portions of the bonding wires 400 connected to the chip pads 130 of the uppermost semiconductor chip 100 of the first chip stack CS1 may be buried in the second lower adhesive film 190S2L.

The stacked semiconductor package 1 may further include a controller chip 200 disposed on the package base substrate 500. The controller chip 200 may be adhered to the package base substrate 500 to be apart from the first chip stack CS1 in the first horizontal direction (the X1 direction) or the second horizontal direction (the X2 direction). For example, the controller chip 200 may be adhered to the package base substrate 500 to be apart from the lowermost semiconductor chip 100 of the first chip stack CS1 in the first horizontal direction (the X1 direction) or the second horizontal direction (the X2 direction). A vertical level of an upper surface of the controller chip 200 may be lower than a vertical level of an upper surface of the first chip stack CS1, that is, the upper surface of the uppermost semiconductor chip 100 of the first chip stack CS1. For example, the vertical level of the upper surface of the controller chip 200 may be closer to the package base substrate 500 than the vertical level of the upper surface of the first chip stack CS1.

The controller chip 200 may include a chip substrate 210. The chip substrate 210 may include the same material as that of the semiconductor substrate 110. For example, the chip substrate 210 may include silicon. The chip substrate 210 may have an active surface and an inactive surface opposite to the active surface. The controller chip 200 may include a controller 212 including a plurality of individual devices of various types on the active surface. The controller 212 may control access to data stored in the semiconductor chips 100. That is, the controller 212 may control write/read operations of the semiconductor chips 100, for example, a flash memory, according to a control command from an external host. The controller 212 may perform wear leveling, garbage collection, bad block management, and error correcting code (ECC) for the non-volatile memory semiconductor chip.

The controller chip 200 may include a plurality of controller pads 230 disposed on the active surface. The controller chip 200 may be adhered on the package base substrate 500 such that the active surface faces downward, that is, the package base substrate 500. The chip connection terminals 250 may be adhered to the controller pads 230, respectively. The chip connection terminals 250 may be, for example, solder balls or bumps. The chip connection terminals 250 may be located between some other ones of the upper connection pads 532 and the controller pads 230 to electrically connect the controller chip 200 to the package base substrate 500.

In some embodiments, an underfill material layer 290 may surround the chip connection terminals 250 and fill a space between the controller chip 200 and the package base substrate 500. The underfill material layer 290 may include, for example, an epoxy resin formed by a capillary under-fill method. In some embodiments, the underfill material layer 290 may be a non-conductive film (NCF).

A mold layer 900 covering the upper surface of the package base substrate 500 and surrounding the semiconductor chips 100, the controller chip 200, the connection structure 300, and the bonding wires 400 may be disposed. The mold layer 900 may include, for example, an epoxy molding compound (EMC).

Each of the semiconductor chips 100 may have a first length L1 in the first horizontal direction (the X1 direction). For example, the first length L1 may be several millimeters or several tens of millimeters.

One end of the first chip stack CS1 and one end of the second chip stack CS2 may be shifted by a second length L2 in the first horizontal direction (the X1 direction) or the second horizontal direction (the X2 direction). The second length L2 may be less than the first length L1. In the first chip stack CS1, the upper semiconductor chip 100 protrudes in the first horizontal direction (the X1 direction) relative to the lower semiconductor chip 100, and the lower semiconductor chip 100 protrudes in the second horizontal direction (the X2 direction) relative to the upper semiconductor chip 100. In the second chip stack CS2, the lower semiconductor chip 100 protrudes in the first horizontal direction (the X1 direction) relative to the upper semiconductor chip 100, and the upper semiconductor chip 100 protrudes in the second horizontal direction (the X2 direction) relative to the lower semiconductor chip 100.

For example, one end of the uppermost semiconductor chip 100 of the first chip stack CS1 in the first horizontal direction (the X1 direction) may be shifted by the second length L2 from one end of the lowermost semiconductor chip 100 of the second chip stack CS2. Alternatively, for example, one end of the uppermost semiconductor chip 100 of the second chip stack CS2 in the second horizontal direction (the X2 direction) may be shifted by the second length L2 from one end of the lowermost semiconductor chip 100 of the first chip stack CS1. For example, the second length L2 may be about 20% to about 60% of the first length L1. In some embodiments, the second length L2 may have the same value as that of the second interval S2.

One end of all the semiconductor chips 100 included in the first chip stack CS1 in the first horizontal direction (the X1 direction) may protrude in the first horizontal direction (the X1 direction) from one end of the semiconductor chips 100 included in the second chip stack CS2, for example, one end of the lowermost semiconductor chip 100 of the second chip stack CS2. One end of all the semiconductor chips 100 included in the second chip stack CS2 in the second horizontal direction (the X2 direction) may protrude in the second horizontal direction (the X2 direction) relative to one end of the semiconductor chip 100 included in the first chip stack CS1, for example, one end of the lowermost semiconductor chip of the first chip stack CS1.

One end of the uppermost semiconductor chip 100 of the second chip stack CS2 in the second horizontal direction (the X2 direction) may be shifted by the second length L2 from one end of the lowermost semiconductor chip 100 of the first chip stack CS1 so that the second chip stack CS2 may overlap at least a portion of the controller chip 200 in a vertical direction (the Z direction), that is, in a top view.

In a top view, the lower surface of the second chip stack CS2 and the upper surface of the first chip stack CS1 may overlap each other by a third length L3 in the first horizontal direction (the X1 direction) or the second horizontal direction (the X2 direction). For example, in a top view, the upper support semiconductor chip 100S2L and the lower support semiconductor chip 100S1H may overlap each other by the third length L3 in the first horizontal direction (the X1 direction) or the second horizontal direction (the X2 direction). The third length L3 may be about 30% to about 80% of the first length L1.

In some embodiments, each of the semiconductor chips 100 may have a length greater in a third horizontal direction (a Y direction) than a length in the first horizontal direction (the X1 direction). Each of the semiconductor chips 100 may have a fourth length L4 in the third horizontal direction (the Y direction) that is greater than the first length L1 in the first horizontal direction (the X1 direction). For example, the first length L1 may be about 14 mm, and the fourth length L4 may be about 18 mm, but are not limited thereto. The third horizontal direction (the Y direction) may be referred to as a major axis direction of each of the semiconductor chips 100, and the first horizontal direction (the X1 direction) and the second horizontal direction (the X2 direction) may be referred to as a minor axis direction of each of the semiconductor chips 100. The chip pads 130 may be disposed adjacent to both ends of each of the semiconductor chips 100 in the minor axis direction, that is, in the first horizontal direction (the X1 direction) or the second horizontal direction (the X2 direction). For example, the chip pads 130 may be disposed adjacent to both sides of the upper surface of each of the semiconductor chips 100 in the minor axis direction to form at least one row in the major axis direction.

In the stacked semiconductor package 1 according to inventive concepts, the second chip stack CS2 may be shifted by the second length L2 in a direction in which the controller chip 200 is located, rather than the first chip stack CS1, that is, in the second horizontal direction (the X2 direction). Accordingly, in the stacked semiconductor package 1, a portion of the second chip stack CS2 having a relatively high height is shifted toward the controller chip 200 having a relatively low height, so that a difference in coefficient of thermal expansion (CTE) in the first horizontal direction (the X1 direction) or the second horizontal direction (the X2 direction) may be reduced in the stacked semiconductor package 1. Accordingly, warpage due to a difference in thermal expansion coefficient in the stacked semiconductor package 1 may be limited and/or prevented, and thus, structural reliability of the stacked semiconductor package 1 may be secured.

Figure 2A:
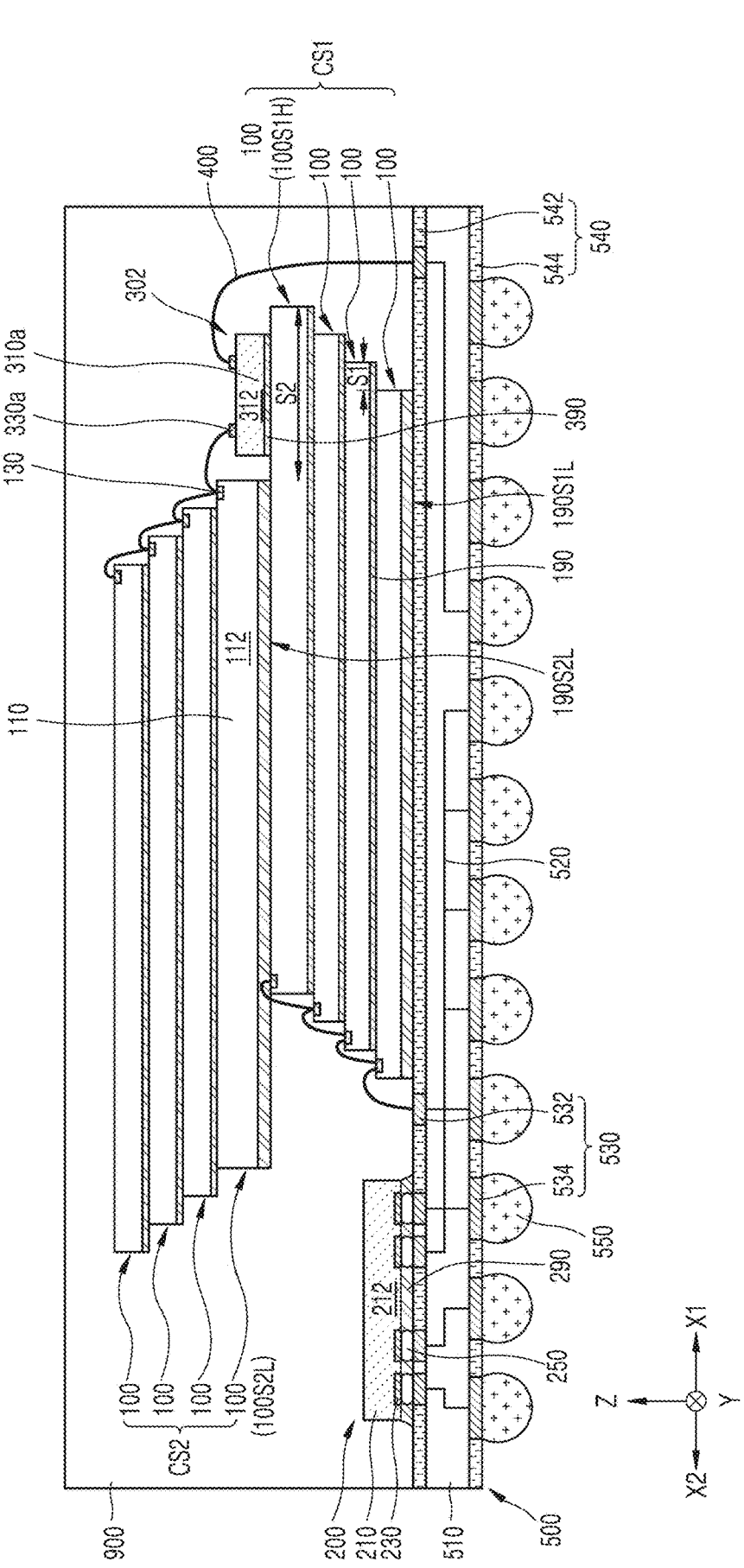
FIGS. 2A and 2B are cross-sectional views and plan layout views illustrating a stacked semiconductor package according to an embodiment.
Figure 2B:
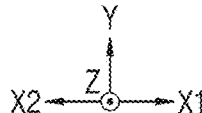

FIGS. 2A and 2B are a cross-sectional view and a plan layout view illustrating a stacked semiconductor package 2 according to an embodiment.

Referring to FIGS. 2A and 2B together, the stacked semiconductor package 2 includes a package base substrate 500 and a plurality of semiconductor chips 100. The semiconductor chips 100 may be sequentially stacked on the package base substrate 500 in the vertical direction (the Z direction). The semiconductor chips 100 may be stacked in a step shape at intervals in the first horizontal direction (the X1 direction) or the second horizontal direction (the X2 direction). The first chip stack CS1 may be adhered on the package base substrate 500, and the second chip stack CS2 may be adhered on the first chip stack CS1.

The semiconductor chips 100 included in the first chip stack CS1 may be stacked in a step shape with a substantially constant interval, for example, the first interval S1, in the first horizontal direction (the X1 direction). The semiconductor chips 100 included in the second chip stack CS2 may be stacked in a step shape with a substantially constant interval, for example, the first interval S1 in a direction opposite to the first horizontal direction (the X1 direction), that is, the second horizontal direction (the X2 direction). The semiconductor chips 100 included in the first chip stack CS1 may be shifted by the first interval S1 in the first horizontal direction (the X1 direction) from the lower semiconductor chip 100, to be stacked on the lower semiconductor chip 100. The semiconductor chips 100 included in the second chip stack CS2 may be shifted by the first interval S1 in the second horizontal direction (the X2 direction) from the lower semiconductor chip 100, to be stacked on the lower semiconductor chip 100.

The lowermost semiconductor chip 100 of the second chip stack CS2, among the semiconductor chips 100, may be shifted by the second interval S2 in the second horizontal direction (the X2 direction) from the uppermost semiconductor chip 100 of the first chip stack CS1, to be stacked on the uppermost semiconductor chip 100 of the first chip stack CS1, among the semiconductor chips 100.

The stacked semiconductor package 2 may include a connection structure 302 adhered to a portion of an upper surface of the uppermost semiconductor chip 100, e.g., the lower support semiconductor chip 100S1H, of the first chip stack CS1, to which the second chip stack CS2 is not adhered. The stacked semiconductor package 2 illustrated in FIGS. 2A and 2B may include the connection structure 302, instead of the connection structure 300 included in the stacked semiconductor package 1 illustrated in FIGS. 1A and 1B.

The connection structure 302 may be adhered to the lower support semiconductor chip 100S1H with a die adhesive film 390 therebetween. In some embodiments, the connection structure 302 may be a buffer chip. The connection structure 302 may include a connection base substrate 310a and a plurality of intermediate connection pads 330a disposed on the connection base substrate 310a. The connection base substrate 310a may include the same material as that of the semiconductor substrate 110.

In the connection structure 302, a buffer element 312 may be formed on an active surface of the connection base substrate 310a.

When updating, such as writing/reading of the semiconductor chips 100 of a flash memory, etc. is frequently performed, the performance of the semiconductor chips 100 may be deteriorated and the lifespan of the semiconductor chips 100 may be shortened. Because the connection structure 302 includes the buffer element 312, a buffering function of collecting frequent small updating and performing updating at once may be performed, thereby limiting and/or preventing performance degradation and shortening of the lifespan of the semiconductor chips 100. In some embodiments, the buffer element 312 may include DRAM. In particular, because the buffer element 312 performs a buffering function in the process of reading and writing data from and to the semiconductor chips 100 included in the second chip stack CS2, data loading performance of the semiconductor chips 100 included in the second chip stack CS2 electrically connected to the package base substrate 500 may be improved by the bonding wire 400 that is relatively longer than the semiconductor chips 100 included in the first chip stack CS1.

The buffer element 312 may be electrically connected to a pair of intermediate connection pads 330a corresponding to each other, among the intermediate connection pads 330a. Each of the pair of intermediate connection pads 330a corresponding to each other may function as an input pad and an output pad of the connection structure 302. For example, some the intermediate connection pads 330a may be input pads of the connection structure 302, and some other ones thereof may be output pads of the connection structure 302.

Anther portion of the bonding wires 400 may connect the chip pads 130 of the lowermost semiconductor chip 100 of the second chip stack CS2 to a portion that is input pads, among the intermediate connection pads 330a of the connection structure 302, and some other ones of the bonding wires 400 may connect some other ones that is output pads among the intermediate connection pads 330a of the connection structure 302 to some other ones of the upper connection pads 532.

Figure 3A:
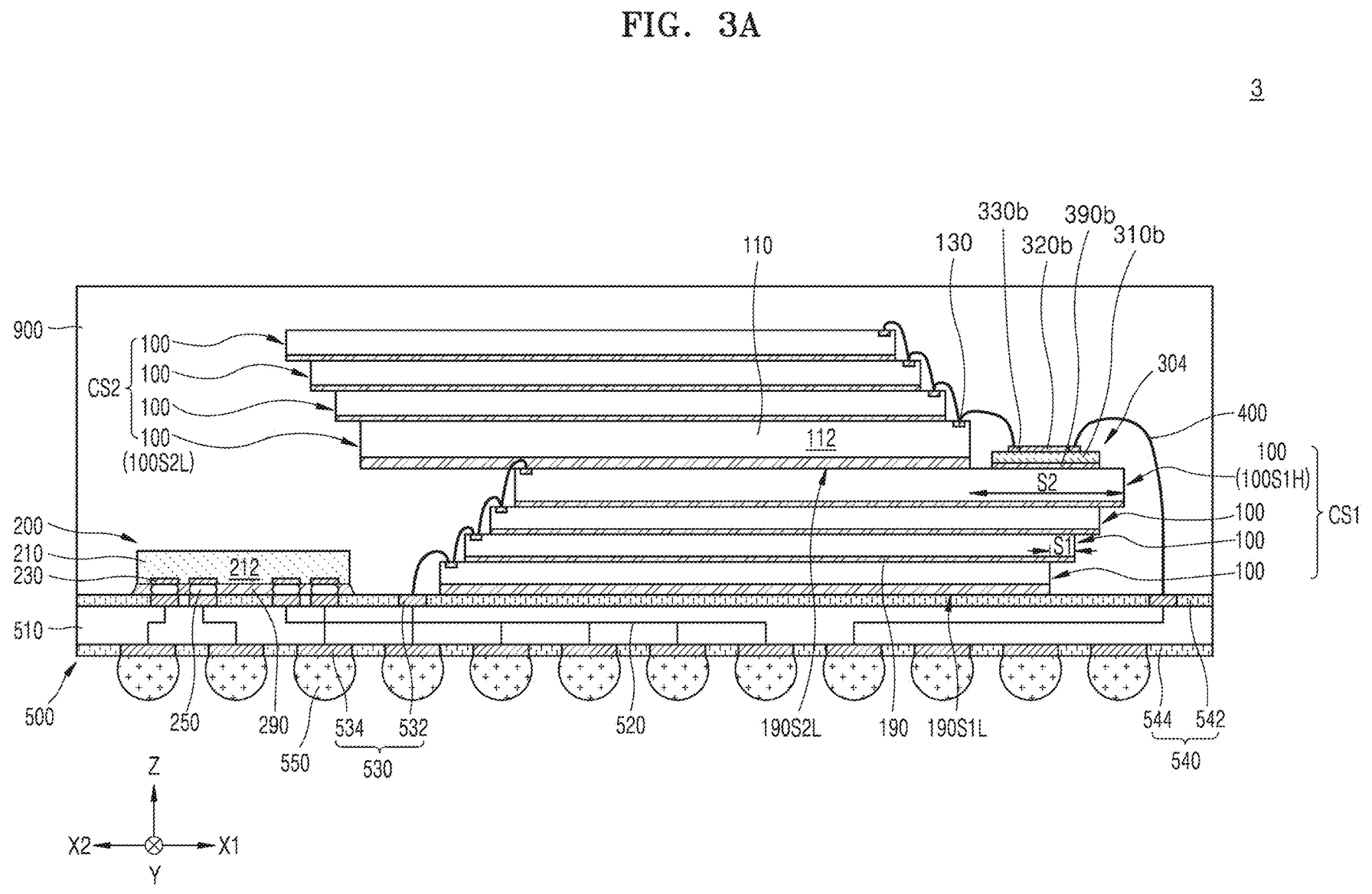
Figure 3B:
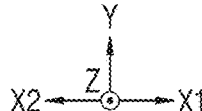

FIGS. 3A and 3B are a cross-sectional view and a plan layout view illustrating a stacked semiconductor package 3 according to an embodiment.

Referring to FIGS. 3A and 3B together, the stacked semiconductor package 3 includes a package base substrate 500 and a plurality of semiconductor chips 100. The semiconductor chips 100 may be sequentially stacked on the package base substrate 500 in the vertical direction (the Z direction). The semiconductor chips 100 may be stacked in a step shape at intervals in the first horizontal direction (the X1 direction) or the second horizontal direction (the X2 direction). The first chip stack CS1 may be adhered on the package base substrate 500, and the second chip stack CS2 may be adhered on the first chip stack CS1.

The semiconductor chips 100 included in the first chip stack CS1 may be stacked in a step shape with a substantially constant interval, for example, the first interval S1, in the first horizontal direction (the X1 direction). The semiconductor chips 100 included in the second chip stack CS2 may be stacked in a step shape with a substantially constant interval, for example, the first interval S1 in a direction opposite to the first horizontal direction (the X1 direction), that is, the second horizontal direction (the X2 direction). The semiconductor chips 100 included in the first chip stack CS1 may be shifted by the first interval S1 in the first horizontal direction (the X1 direction) from the lower semiconductor chip 100, to be stacked on the lower semiconductor chip 100. The semiconductor chips 100 included in the second chip stack CS2 may be shifted by the first interval S1 in the second horizontal direction (the X2 direction) from the lower semiconductor chip 100, to be stacked on the lower semiconductor chip 100.

The lowermost semiconductor chip 100 of the second chip stack CS2, among the semiconductor chips 100, may be shifted by the second interval S2 in the second horizontal direction (the X2 direction) from the uppermost semiconductor chip 100 of the first chip stack CS1, to be stacked on the uppermost semiconductor chip 100 of the first chip stack CS1, among the semiconductor chips 100.

The stacked semiconductor package 3 may include a connection structure 302 adhered to a portion of an upper surface of the uppermost semiconductor chip 100, e.g., the lower support semiconductor chip 100S1H, of the first chip stack CS1, to which the second chip stack CS2 is not adhered. The stacked semiconductor package 3 illustrated in FIGS. 3A and 3B may include the connection structure 304, instead of the connection structure 300 included in the stacked semiconductor package 1 illustrated in FIGS. 1A and 1B.

The connection structure 304 may be a film substrate. The connection structure 304 may include a base film 310b, a plurality of intermediate connection lines 320b disposed on an upper surface of the base film 310b, and a plurality of intermediate connection lines 320b disposed on the upper surface of the base film 310b and connected to both ends of the intermediate connection lines 320b. The connection structure 304 may further include an adhesive material layer 390b disposed on a lower surface of the base film 310b. The adhesive material layer 390b may be located between the upper surface of the lower support semiconductor chip 100S1H and a lower surface of the base film 310b. The connection structure 304 may be adhered to the upper surface of the lower support semiconductor chip 100S1H through the adhesive material layer 390b.

The base film 310b may include an organic insulating material. The base film 310b may include, for example, a resin-based material formed of polyimide or polyester or other known materials, and may have flexibility.

The intermediate connection lines 320b and the intermediate connection pads 330b may be formed of, for example, aluminum foil or copper foil or by patterning a metal layer formed on the base film 310b by a casting, laminating, or electroplating method.

In some embodiments, the intermediate connection pads 330b may be a portion of the intermediate connection lines 320b or may be a part plated with tin (Sb), gold (Au), nickel (Ni), or lead (Pb) on the intermediate connection lines 320b. In some other embodiments, the intermediate connection pads 330b may be electrically connected to the intermediate connection lines 320b and may include a separately formed conductive material.

Some other ones of the bonding wires 400 may connect the chip pads 130 of the lowermost semiconductor chip 100 of the second chip stack CS2 to some the intermediate connection pads 330b of the connection structure 304, and some other ones of the bonding wires 400 may connect some other ones of the intermediate connection pads 330b of the connection structure 304 to some other ones of the upper connection pads 532.

Figure 4A:
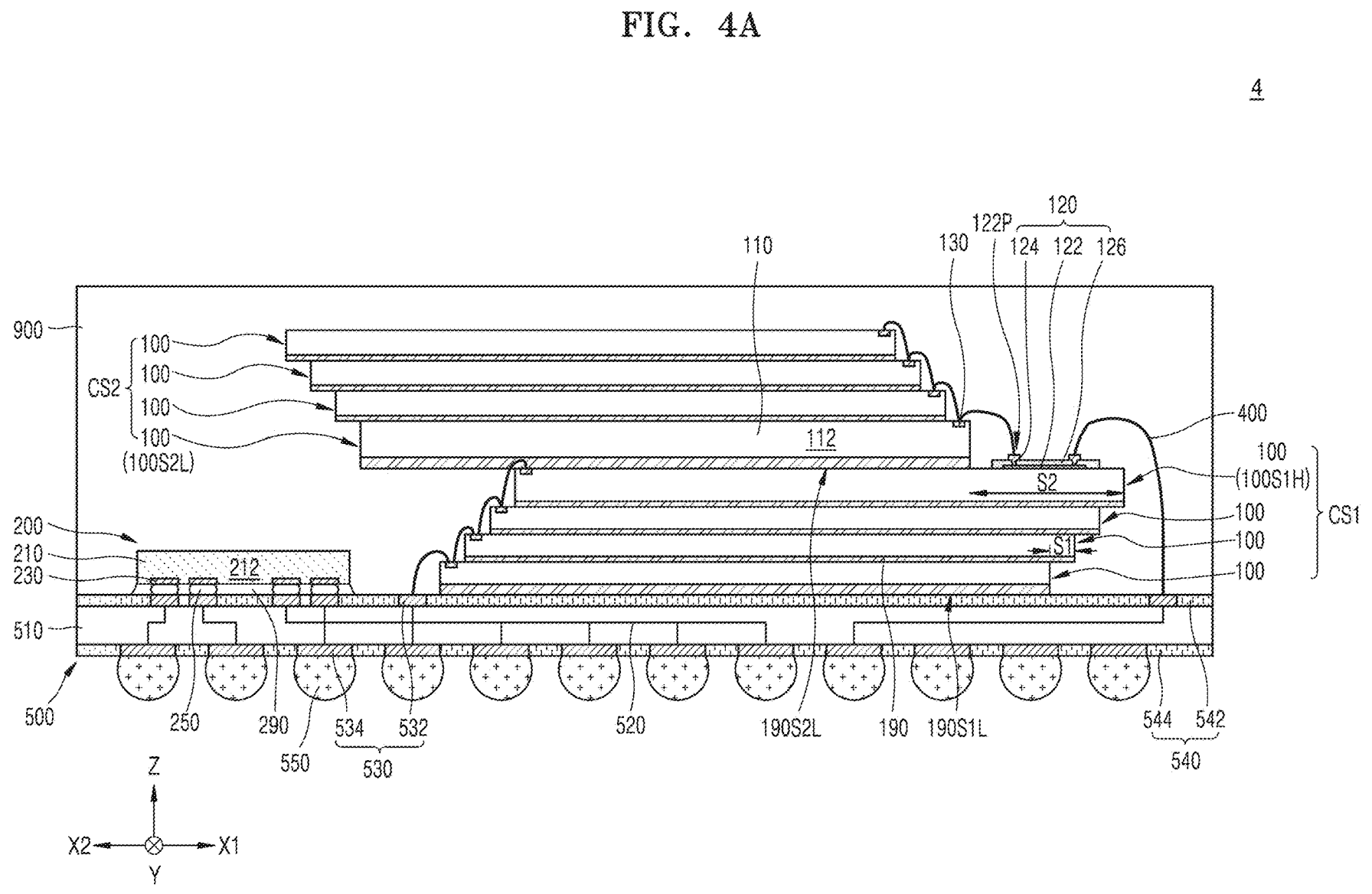
Figure 4B:
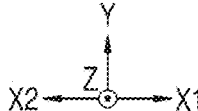

FIGS. 4A and 4B are a cross-sectional view and a plan layout views of a stacked semiconductor package 4 according to an embodiment.

Referring to FIGS. 4A and 4B together, the stacked semiconductor package 2 includes a package base substrate 500 and a plurality of semiconductor chips 100. The semiconductor chips 100 may be sequentially stacked on the package base substrate 500 in the vertical direction (the Z direction). The semiconductor chips 100 may be stacked in a step shape at intervals in the first horizontal direction (the X1 direction) or the second horizontal direction (the X2 direction). The first chip stack CS1 may be adhered on the package base substrate 500, and the second chip stack CS2 may be adhered on the first chip stack CS1.

The semiconductor chips 100 included in the first chip stack CS1 may be stacked in a step shape with a substantially constant interval, for example, the first interval S1, in the first horizontal direction (the X1 direction). The semiconductor chips 100 included in the second chip stack CS2 may be stacked in a step shape with a substantially constant interval, for example, the first interval S1 in a direction opposite to the first horizontal direction (the X1 direction), that is, the second horizontal direction (the X2 direction). The semiconductor chips 100 included in the first chip stack CS1 may be shifted by the first interval S1 in the first horizontal direction (the X1 direction) from the lower semiconductor chip 100, to be stacked on the lower semiconductor chip 100. The semiconductor chips 100 included in the second chip stack CS2 may be shifted by the first interval S1 in the second horizontal direction (the X2 direction) from the lower semiconductor chip 100, to be stacked on the lower semiconductor chip 100.

The lowermost semiconductor chip 100 of the second chip stack CS2, among the semiconductor chips 100, may be shifted by the second interval S2 in the second horizontal direction (the X2 direction) from the uppermost semiconductor chip 100 of the first chip stack CS1, to be stacked on the uppermost semiconductor chip 100 of the first chip stack CS1, among the semiconductor chips 100.

The stacked semiconductor package 4 may include a connection structure 120 disposed in a portion of an upper surface of the uppermost semiconductor chip 100, e.g., the lower support semiconductor chip 100S1H, of the first chip stack CS1, to which the second chip stack CS2 is not adhered. The stacked semiconductor package 4 illustrated in FIGS. 4A and 4B may include a connection structure 120 and a plurality of intermediate connection pads 122P disposed on the connection structure 120, instead of the connection structure 300 included in the stacked semiconductor package 1 illustrated in FIGS. 1A and 1B.

The connection structure 120 may be a redistribution structure disposed on the upper surface of the lower support semiconductor chip 100S1H. The connection structure 120 may include a plurality of intermediate connection lines 122, a plurality of intermediate connection vias 124, and an intermediate connection insulating layer 126. The intermediate connection insulating layer 126 may cover at least a portion of the upper surface of the lower support semiconductor chip 100S1H and surround the intermediate connection lines 122 and the intermediate connection vias 124. Unlike the intermediate connection structure 320 shown in FIGS. 1A and 1B that is disposed on the upper surface of the connection base substrate 310, the connection structure 120 may be substantially the same as the intermediate connection structure 320, except that the connection structure 120 is disposed on the upper surface of the lower support semiconductor chip 100S1H.

In some embodiments, the intermediate connection lines 122 may extend along the upper surface of the lower support semiconductor chip 100S1H. For example, each of the intermediate connection lines 122 may extend in the first horizontal direction (the X1 direction).

The intermediate connection vias 124 may connect the intermediate connection lines 122 to the intermediate connection pads 122P. For example, the intermediate connection via 124 may be connected to both ends of one intermediate connection line 122, among the intermediate connection lines 122. One pair of intermediate connection pads 122P, among the intermediate connection pads 122P, may be electrically connected to both ends of one intermediate connection line 122 through a pair of intermediate connection vias 124.

Some other ones of the bonding wires 400 may be sequentially connected to the chip pads 130 of each of the semiconductor chips 100 included in the second chip stack CS2 and to some the intermediate connection pads 122P disposed on the connection structure 300, from the chip pads 130 of the uppermost semiconductor chip 100 of the second chip stack CS2 to the chip pads 130 of the lowermost semiconductor chip 100. Some other ones of the bonding wires 400 may connect some other ones of the intermediate connection pads 122P disposed on the connection structure 120 to some other ones of the upper connection pads 532.

FIGS. 4A and 4B show that the connection structure 120 is disposed only on a portion of the upper surface of the lower support semiconductor chip 100S1H, but is not limited thereto. In some embodiments, the connection structure 120 may be formed to cover the entire upper surface of the lower support semiconductor chip 100S1H, and the chip pads 130 included in the lower support semiconductor chip 100S1H may be disposed on the connection structure 120, like the intermediate connection pads 122P.

Figure 5A:
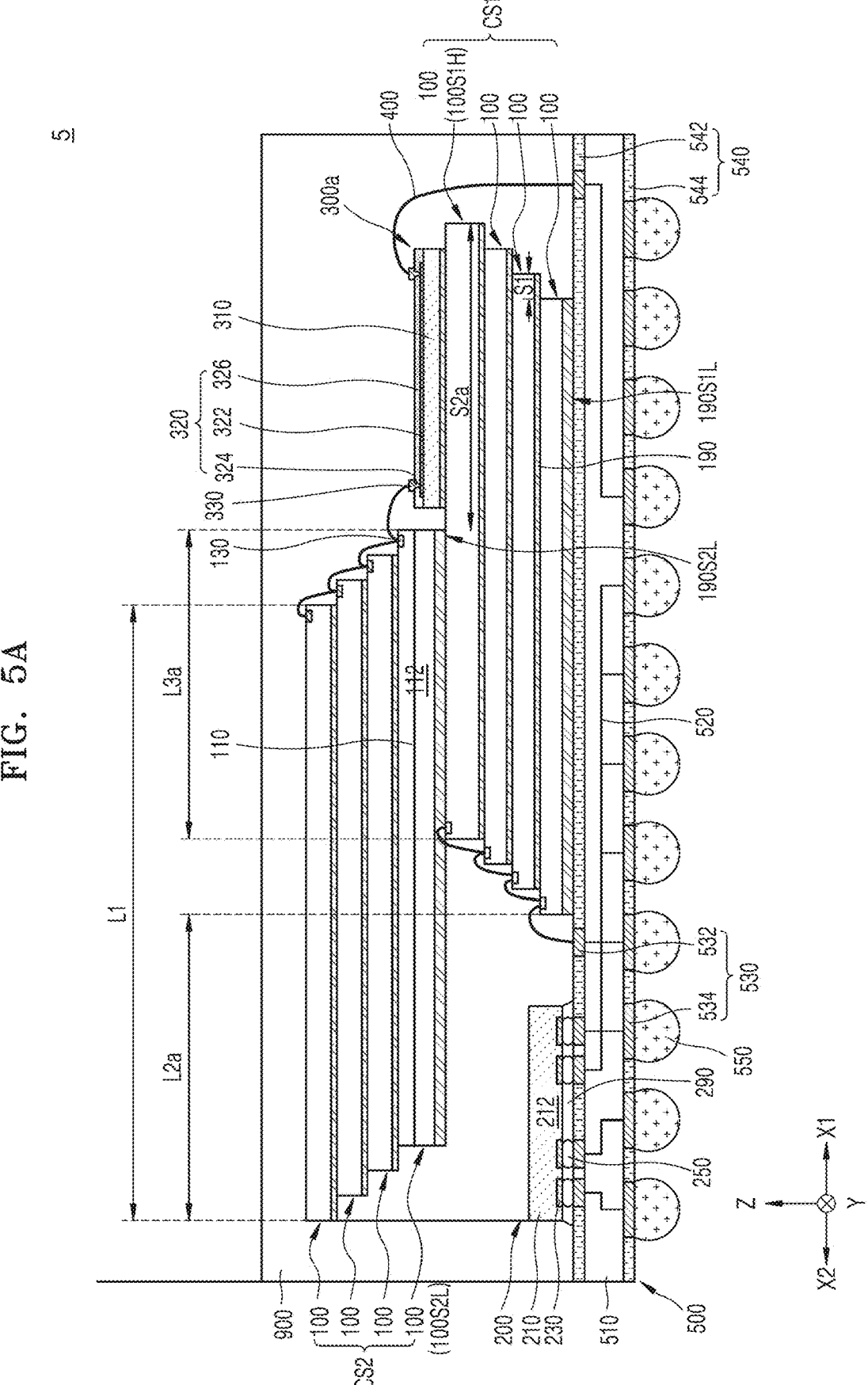
FIGS. 5A and 5B are a cross-sectional view and a plan layout view illustrating a stacked semiconductor package according to an embodiment.
Figure 5B:
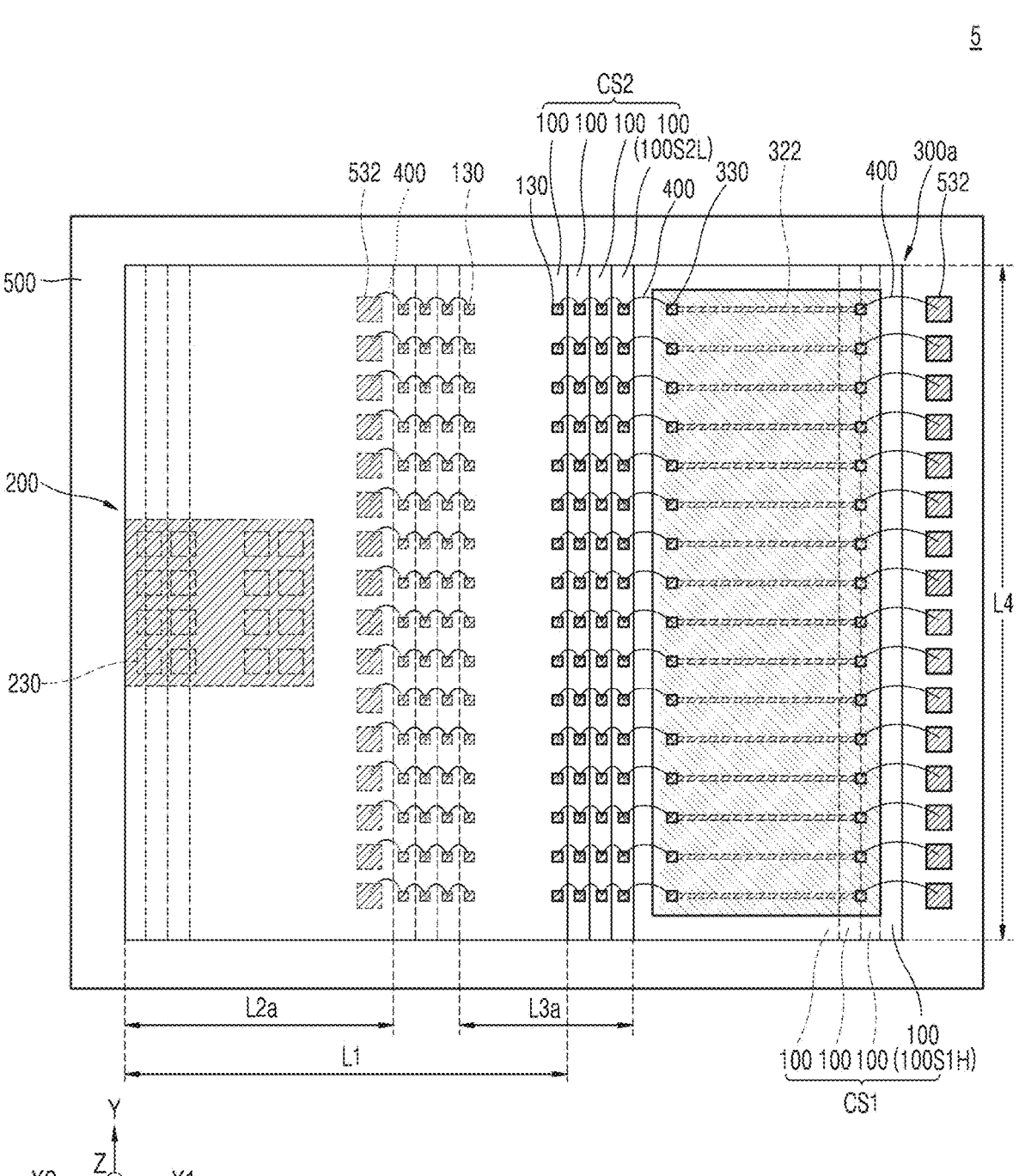

FIGS. 5A and 5B are a cross-sectional view and a plan layout view illustrating a stacked semiconductor package 5 according to an embodiment.

Referring to FIGS. 5A and 5B together, the stacked semiconductor package 2 includes a package base substrate 500 and a plurality of semiconductor chips 100. The semiconductor chips 100 may be sequentially stacked on the package base substrate 500 in the vertical direction (the Z direction). The semiconductor chips 100 may be stacked in a step shape at intervals in the first horizontal direction (the X1 direction) or the second horizontal direction (the X2 direction). The first chip stack CS1 may be adhered on the package base substrate 500, and the second chip stack CS2 may be adhered on the first chip stack CS1.

The semiconductor chips 100 included in the first chip stack CS1 may be stacked in a step shape with a substantially constant interval, for example, the first interval S1, in the first horizontal direction (the X1 direction). The semiconductor chips 100 included in the second chip stack CS2 may be stacked in a step shape with a substantially constant interval, for example, the first interval S1 in a direction opposite to the first horizontal direction (the X1 direction), that is, the second horizontal direction (the X2 direction). The semiconductor chips 100 included in the first chip stack CS1 may be shifted by the first interval S1 in the first horizontal direction (the X1 direction) from the lower semiconductor chip 100, to be stacked on the lower semiconductor chip 100. The semiconductor chips 100 included in the second chip stack CS2 may be shifted by the first interval S1 in the second horizontal direction (the X2 direction) from the lower semiconductor chip 100, to be stacked on the lower semiconductor chip 100.

The lowermost semiconductor chip 100 of the second chip stack CS2, among the semiconductor chips 100, may be shifted by the second interval S2a in the second horizontal direction (the X2 direction) from the uppermost semiconductor chip 100 of the first chip stack CS1, to be stacked on the uppermost semiconductor chip 100 of the first chip stack CS1, among the semiconductor chips 100. The second interval S2a may have a greater value than the first interval S1.

The stacked semiconductor package 5 may include a connection structure 300a disposed in a portion of an upper surface of the uppermost semiconductor chip 100, e.g., the lower support semiconductor chip 100S1H, of the first chip stack CS1, to which the second chip stack CS2 is not adhered. The stacked semiconductor package 5 illustrated in FIGS. 5A and 5B may include a connection structure 300a, instead of the connection structure 300 included in the stacked semiconductor package 1 illustrated in FIGS. 1A and 1B. The connection structure 300a is substantially similar to the connection structure 300 included in the stacked semiconductor package 1 shown in FIGS. 1A and 1B, but a length of the connection structure 300a in the first horizontal direction (the X1 direction) or the second horizontal direction (the X2 direction) may be greater than a length of the connection structure 300.

The semiconductor chips 100 may have substantially the same length in each of the first horizontal direction (the X1 direction) and the third horizontal direction (the Y direction). Each of the semiconductor chips 100 may have the first length L1 in the first horizontal direction (the X1 direction). One end of the first chip stack CS1 and one end of the second chip stack CS2 may be shifted by a second length L2a in the first horizontal direction (the X1 direction) or the second horizontal direction (the X2 direction). In the first chip stack CS1, the upper semiconductor chip 100 protrudes in the first horizontal direction (relative to the lower semiconductor chip 100, and the lower semiconductor chip 100 protrudes in the second horizontal direction (the X2 direction) relative to the upper semiconductor chip 100. In the second chip stack CS2, the lower semiconductor chip 100 protrudes in the first horizontal direction (the X1 direction) relative to the upper semiconductor chip 100, and the upper semiconductor chip 100 protrudes in the second horizontal direction (the X2 direction) relative to the lower semiconductor chip 100.

For example, one end of the uppermost semiconductor chip 100 of the first chip stack CS1 in the first horizontal direction (the X1 direction) may be shifted by the second length L2a from one end of the lowermost semiconductor chip 100 of the second chip stack CS2. Alternatively, for example, one end of the uppermost semiconductor chip 100 of the second chip stack CS2 in the second horizontal direction (the X2 direction) may be shifted by the second length L2a from one end of the lowermost semiconductor chip 100 of the first chip stack CS1. For example, the second length L2a may be greater than 20% of the first length L1. In some embodiments, the second length L2a may have the same value as that of the second interval S2a. For example, the second length L2a and the second interval S2a may be 50% of the first length L1.

In the second horizontal direction (the X2 direction), one end of the uppermost semiconductor chip 100 of the second chip stack CS2 is shifted by the second length L2a from one end of the lowermost semiconductor chip 100 of the first chip stack CS1 so that the second chip stack CS2 may overlap at least a portion of the controller chip 200 in the vertical direction (the Z direction), e.g., in a top view. In some embodiments, the controller chip 200 may completely overlap the second chip stack CS2 in a top view.

In a top view, the lower surface of the second chip stack CS2 and the upper surface of the first chip stack CS1 may overlap by a third length L3a in the first horizontal direction (the X1 direction) or the second horizontal direction (the X2 direction). The third length L3a may be 50% of the first length L1.

Figure 6A:
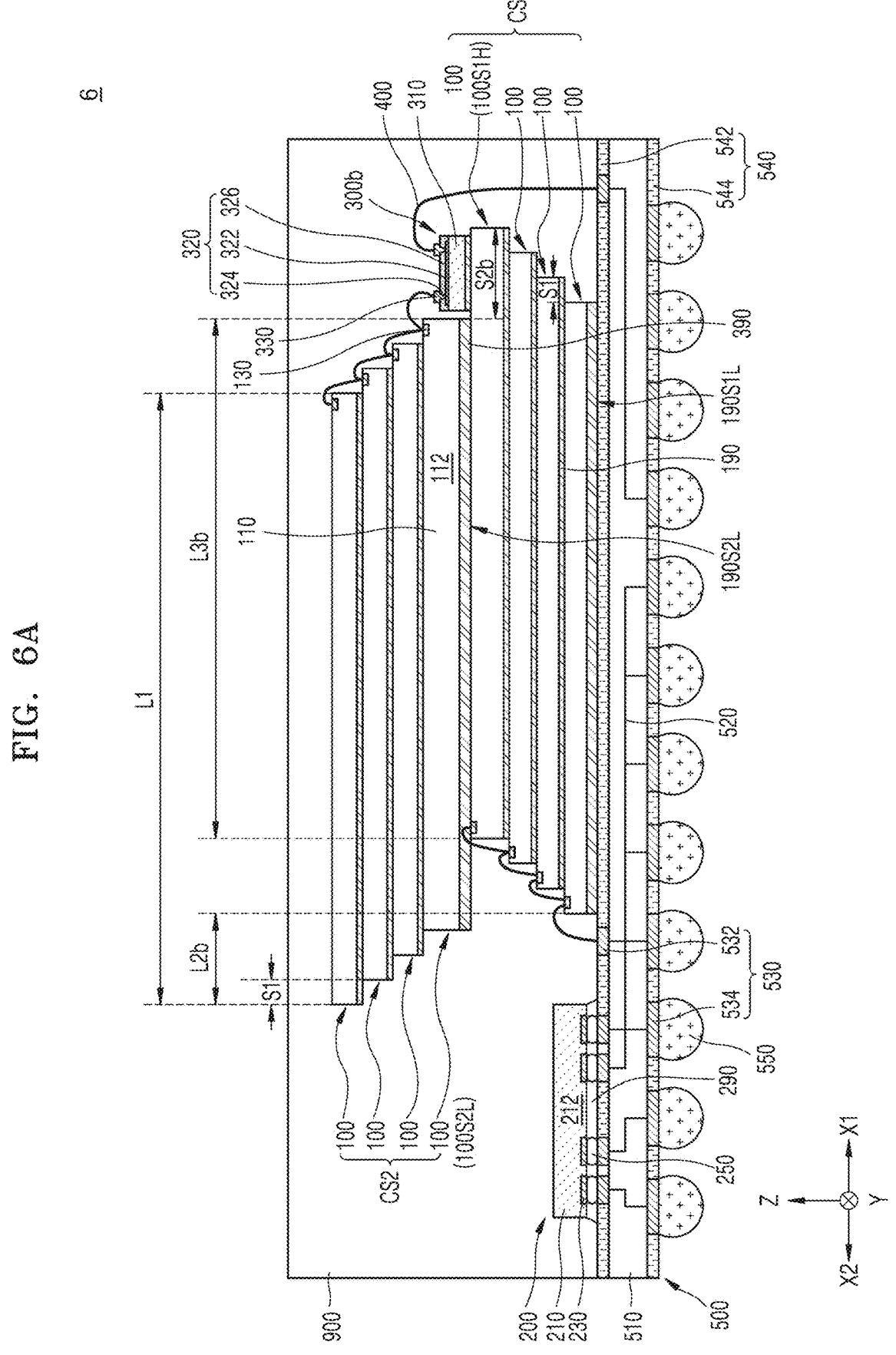
FIGS. 6A and 6B are a cross-sectional view and a plan layout view of a stacked semiconductor package according to an embodiment.
Figure 6B:
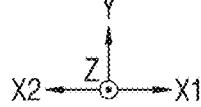

FIGS. 6A and 6B are a cross-sectional view and a plan layout view of a stacked semiconductor package 6 according to an embodiment.

Referring to FIGS. 6A and 6B together, the stacked semiconductor package 2 includes a package base substrate 500 and a plurality of semiconductor chips 100. The semiconductor chips 100 may be sequentially stacked on the package base substrate 500 in the vertical direction (the Z direction). The semiconductor chips 100 may be stacked in a step shape at intervals in the first horizontal direction (the X1 direction) or the second horizontal direction (the X2 direction). The first chip stack CS1 may be adhered on the package base substrate 500, and the second chip stack CS2 may be adhered on the first chip stack CS1.

The semiconductor chips 100 included in the first chip stack CS1 may be stacked in a step shape with a substantially constant interval, for example, the first interval S1, in the first horizontal direction (the X1 direction). The semiconductor chips 100 included in the second chip stack CS2 may be stacked in a step shape with a substantially constant interval, for example, the first interval S1 in a direction opposite to the first horizontal direction (the X1 direction), that is, the second horizontal direction (the X2 direction). The semiconductor chips 100 included in the first chip stack CS1 may be shifted by the first interval S1 in the first horizontal direction (the X1 direction) from the lower semiconductor chip 100, to be stacked on the lower semiconductor chip 100. The semiconductor chips 100 included in the second chip stack CS2 may be shifted by the first interval S1 in the second horizontal direction (the X2 direction) from the lower semiconductor chip 100, to be stacked on the lower semiconductor chip 100.

The lowermost semiconductor chip 100 of the second chip stack CS2, among the semiconductor chips 100, may be shifted by the second interval S2b in the second horizontal direction (the X2 direction) from the uppermost semiconductor chip 100 of the first chip stack CS1, to be stacked on the uppermost semiconductor chip 100 of the first chip stack CS1, among the semiconductor chips 100. The second interval S2b may have a greater value than the first interval S1.

The stacked semiconductor package 6 may include a connection structure 300b disposed in a portion of an upper surface of the uppermost semiconductor chip 100, e.g., the lower support semiconductor chip 100S1H, of the first chip stack CS1, to which the second chip stack CS2 is not adhered. The stacked semiconductor package 6 illustrated in FIGS. 6A and 6B may include a connection structure 300b, instead of the connection structure 300 included in the stacked semiconductor package 1 illustrated in FIGS. 1A and 1B. The connection structure 300b is substantially similar to the connection structure 300 included in the stacked semiconductor package 1 shown in FIGS. 1A and 1B, but a length of the connection structure 300b in the first horizontal direction (the X1 direction) or the second horizontal direction (the X2 direction) may be less than a length of the connection structure 300.

The semiconductor chips 100 may have substantially the same length in each of the first horizontal direction (the X1 direction) and the third horizontal direction (the Y direction). Each of the semiconductor chips 100 may have the first length L1 in the first horizontal direction (the X1 direction). One end of the first chip stack CS1 and one end of the second chip stack CS2 may be shifted by a second length L2a in the first horizontal direction (the X1 direction) or the second horizontal direction (the X2 direction). In the first chip stack CS1, the upper semiconductor chip 100 protrudes in the first horizontal direction (the X1 direction) relative to the lower semiconductor chip 100, and the lower semiconductor chip 100 protrudes in the second horizontal direction (the X2 direction) relative to the upper semiconductor chip 100. In the second chip stack CS2, the lower semiconductor chip 100 protrudes in the first horizontal direction (the X1 direction) relative to the upper semiconductor chip 100, and the upper semiconductor chip 100 protrudes in the second horizontal direction (the X2 direction) relative to the lower semiconductor chip 100.

For example, one end of the uppermost semiconductor chip 100 of the first chip stack CS1 in the first horizontal direction (the X1 direction) may be shifted by the second length L2b from one end of the lowermost semiconductor chip 100 of the second chip stack CS2. Alternatively, for example, one end of the uppermost semiconductor chip 100 of the second chip stack CS2 in the second horizontal direction (the X2 direction) may be shifted by the second length L2b from one end of the lowermost semiconductor chip 100 of the first chip stack CS1. For example, the second length L2b may be greater than 5% of the first length L1 and less than 25% of the first length L1. In some embodiments, the second length L2b may have the same value as the second interval S2b.

In the second horizontal direction (the X2 direction), one end of the uppermost semiconductor chip 100 of the second chip stack CS2 is shifted by the second length L2b from one end of the lowermost semiconductor chip 100 of the first chip stack CS1 so that the second chip stack CS2 may not overlap the controller chip 200 in the vertical direction (the Z direction), e.g., in a top view.

In a top view, the lower surface of the second chip stack CS2 and the upper surface of the first chip stack CS1 may overlap by a third length L3b in the first horizontal direction (the X1 direction) or the second horizontal direction (the X2 direction). The third length L3b may be greater than about 50% of the first length L1. For example, the third length L3b may be greater than 75% and less than 95% of the first length L1.

FIGS. 7A to 7E are cross-sectional views illustrating a method of manufacturing a stacked semiconductor package according to an embodiment. In detail, FIGS. 7A to 9E are cross-sectional views illustrating a method of manufacturing the stacked semiconductor package 1 shown in FIGS. 1A and 1B.

Figure 7A:
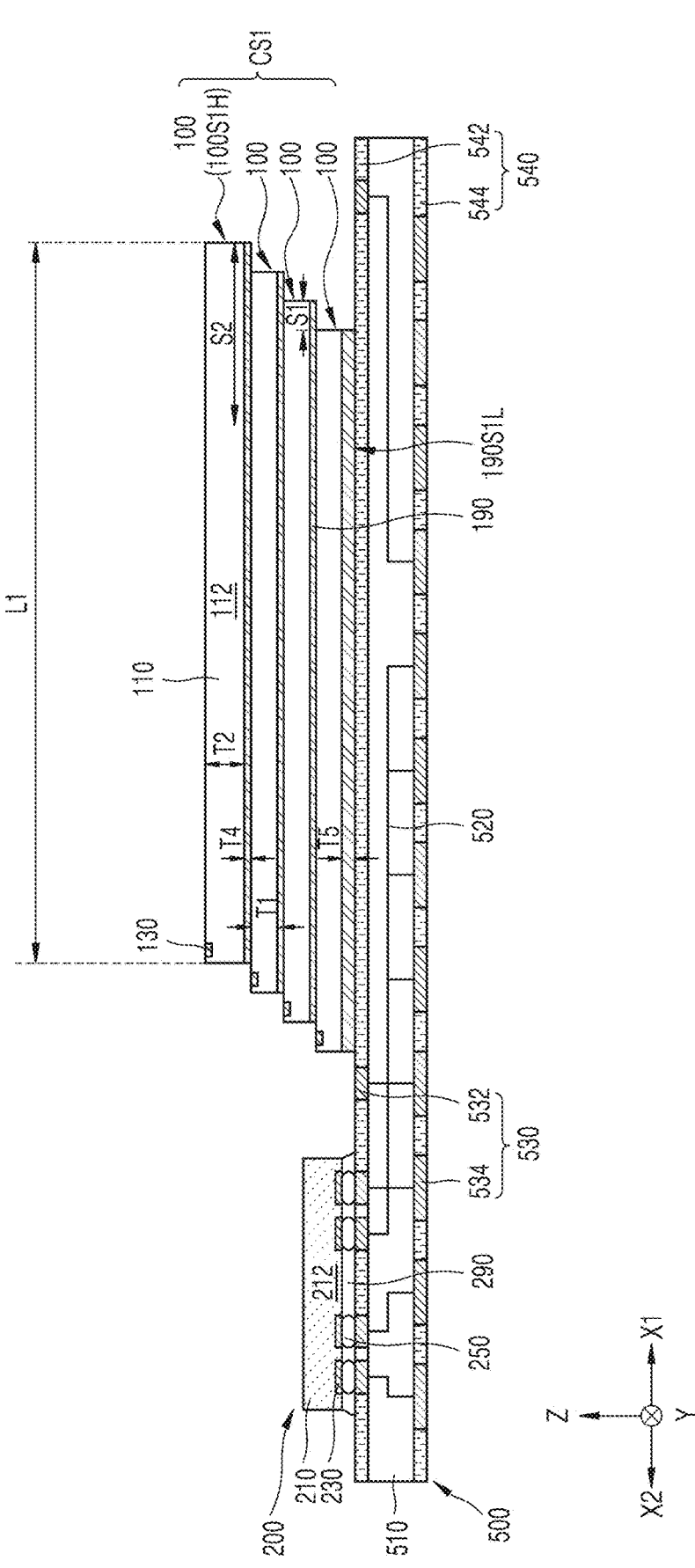

Referring to FIG. 7A, the first chip stack CS1 and the controller chip 200 are adhered on the package base substrate 500.

The semiconductor chips 100 included in the first chip stack CS1 may have substantially the same length in each of the first horizontal direction (the X1 direction) and the third horizontal direction (the Y direction). Each of the semiconductor chips 100 included in the first chip stack CS1 may have the first length L1 in the first horizontal direction (the X1 direction). The semiconductor chips 100 included in the first chip stack CS1 may be stacked in a step shape with a substantially constant interval, for example, the first interval S1, in the first horizontal direction (the X1 direction). The semiconductor chips 100 included in the first chip stack CS1 may be shifted by the first interval S1 in the first horizontal direction (the X1 direction) from the lower semiconductor chip 100, to be stacked on the lower semiconductor chip 100.

Each of the semiconductor chips 100, except for the lower support semiconductor chip 100S1H, among the semiconductor chips 100 included in the first chip stack CS, may have the first thickness T1, and the lower support semiconductor chip 100S1H may have the second thickness T2, The second thickness T2 may be greater than the first thickness T1.

The semiconductor chips 100 included in the first chip stack CS1 may have a plurality of die adhesive films 190 adhered to a lower surface thereof and may be adhered to a structure below the semiconductor chips 100 with the die adhesive film 190 therebetween. For example, the lowermost semiconductor chip 100, among the semiconductor chips 100, that is, the lowermost semiconductor chip 100 of the first chip stack CS1, may be adhered to the package base substrate 500 with the die adhesive film 190 therebetween, and each of the other semiconductor chips 100 may be adhered to another semiconductor chip 100 therebelow with the die adhesive film 190 therebetween.

A thickness of some the die adhesive films 190 may be different from a thickness of the rest. Each of the die adhesive films 190, except for the first lower adhesive film 190S1L, among the die adhesive films 190, may have the fourth thickness T4, and the first lower adhesive film 190S1L may have the fifth thickness T5. The fifth thickness T5 may be greater than the fourth thickness T4.

The controller chip 200 may be adhered on the package base substrate 500 such that the active surface on which the controller pad 230 is disposed faces downward, that is, the package base substrate 500. The chip connection terminals 250 may be adhered to the controller pads 230. The chip connection terminals 250 may be located between some other ones of the upper connection pads 532 and the controller pads 230. The underfill material layer 290 may surround the chip connection terminals 250 and fill a space between the controller chip 200 and the package base substrate 500.

Figure 7B:
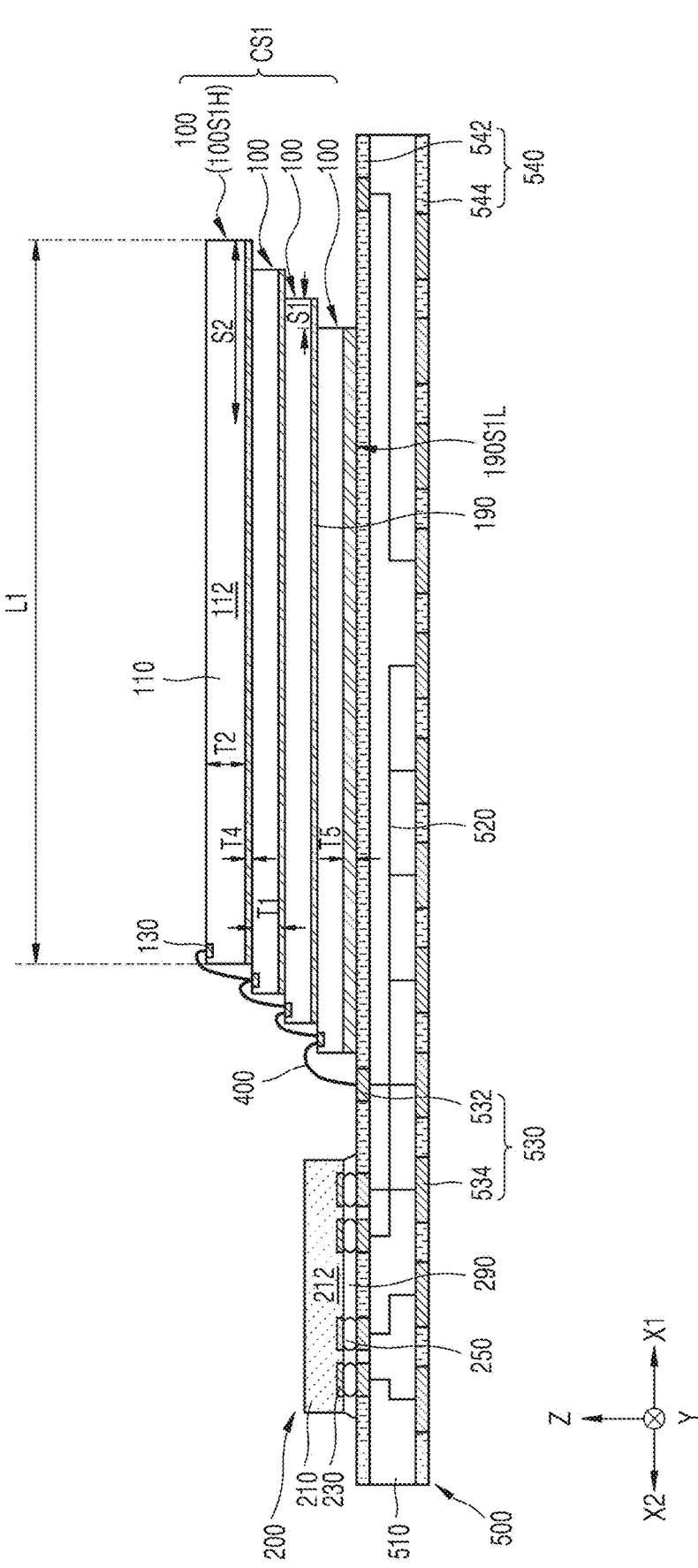

Referring to FIG. 7B, the bonding wires 400 are formed to be sequentially connected to the chip pads 130 of each of the semiconductor chips 100 included in the first chip stack CS1 from the chip pads 130 of the uppermost semiconductor chip 100 of the first chip stack CS1 to the chip pads 130 of the lower most semiconductor chip 100, and connect the chip pads 130 of the lowermost semiconductor chip 100 to some the upper connection pads 532.

Figure 7C:
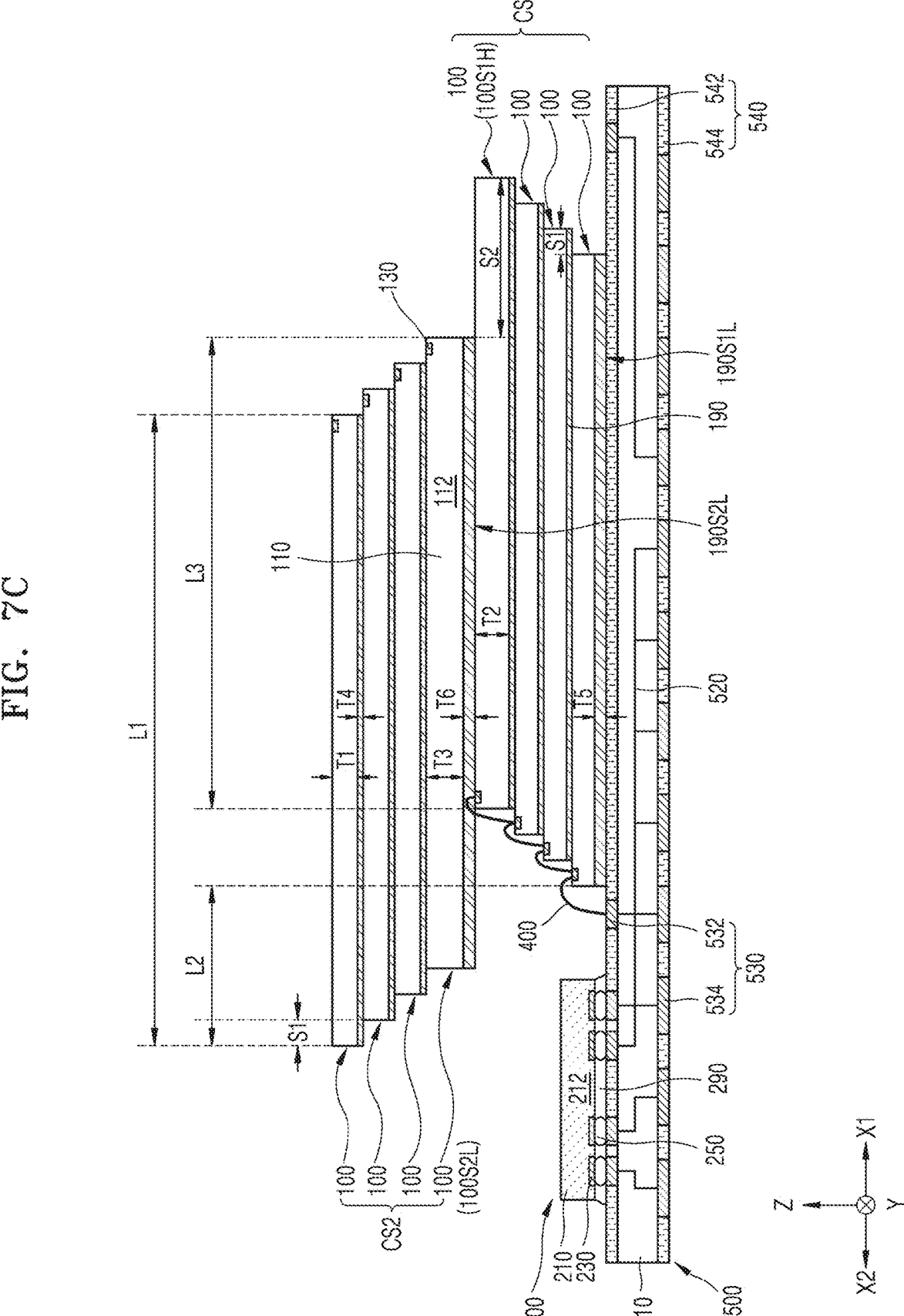

Referring to FIG. 7C, the second chip stack CS2 is stacked on the first chip stack CS1. The semiconductor chips 100 included in the second chip stack CS2 may be stacked in a step shape with a substantially constant interval, for example, the first interval S1 in a direction opposite to the first horizontal direction (the X1 direction), that is, the second horizontal direction (the X2 direction). The semiconductor chips 100 included in the second chip stack CS2 may be shifted by the first interval S1 in the second horizontal direction (the X1 direction) from the lower semiconductor chip 100, to be stacked on the lower semiconductor chip 100.

The lowermost semiconductor chip 100 of the second chip stack CS2, among the semiconductor chips 100, may be shifted by the second interval S2 in the second horizontal direction (the X2 direction) from the uppermost semiconductor chip 100 of the first chip stack CS1, to be stacked on the uppermost semiconductor chip 100 of the first chip stack CS1, among the semiconductor chips 100. The second interval S2 may have a greater value than the first interval S1.

One end of the first chip stack CS1 and one end of the second chip stack CS2 may be shifted by the second length L2 in the first horizontal direction (the X1 direction) or the second horizontal direction (the X2 direction). In the first chip stack CS1, the upper semiconductor chip 100 protrudes in the first horizontal direction (the X1 direction) relative to the lower semiconductor chip 100, and the lower semiconductor chip 100 protrudes in the second horizontal direction (the X2 direction) relative to the upper semiconductor chip 100. In the second chip stack CS2, the lower semiconductor chip 100 protrudes in the first horizontal direction (the X1 direction) relative to the upper semiconductor chip 100, and the upper semiconductor chip 100 protrudes in the second horizontal direction (the X2 direction) relative to the lower semiconductor chip 100.

For example, one end of the uppermost semiconductor chip 100 of the first chip stack CS1 in the first horizontal direction (the X1 direction) may be shifted by the second length L2 from one end of the lowermost semiconductor chip 100 of the second chip stack CS2. Alternatively, for example, one end of the uppermost semiconductor chip 100 of the second chip stack CS2 in the second horizontal direction (the X2 direction) may be shifted by the second length L2 from one end of the lowermost semiconductor chip 100 of the first chip stack CS1. For example, the second length L2 may be 20% or more of the first length L1. In some embodiments, the second length L2 may have the same value as that of the second interval S2.

One end of the uppermost semiconductor chip 100 of the second chip stack CS2 in the second horizontal direction (the X2 direction) may be shifted by the second length L2 from one end of the lowermost semiconductor chip 100 of the first chip stack CS1 so that the second chip stack CS2 may overlap at least a portion of the controller chip 200 in a vertical direction (the Z direction), that is, in a top view.

In a top view, the lower surface of the second chip stack CS2 and the upper surface of the first chip stack CS1 may overlap each other by a third length L3 in the first horizontal direction (the X1 direction) or the second horizontal direction (the X2 direction).

Figure 7D:
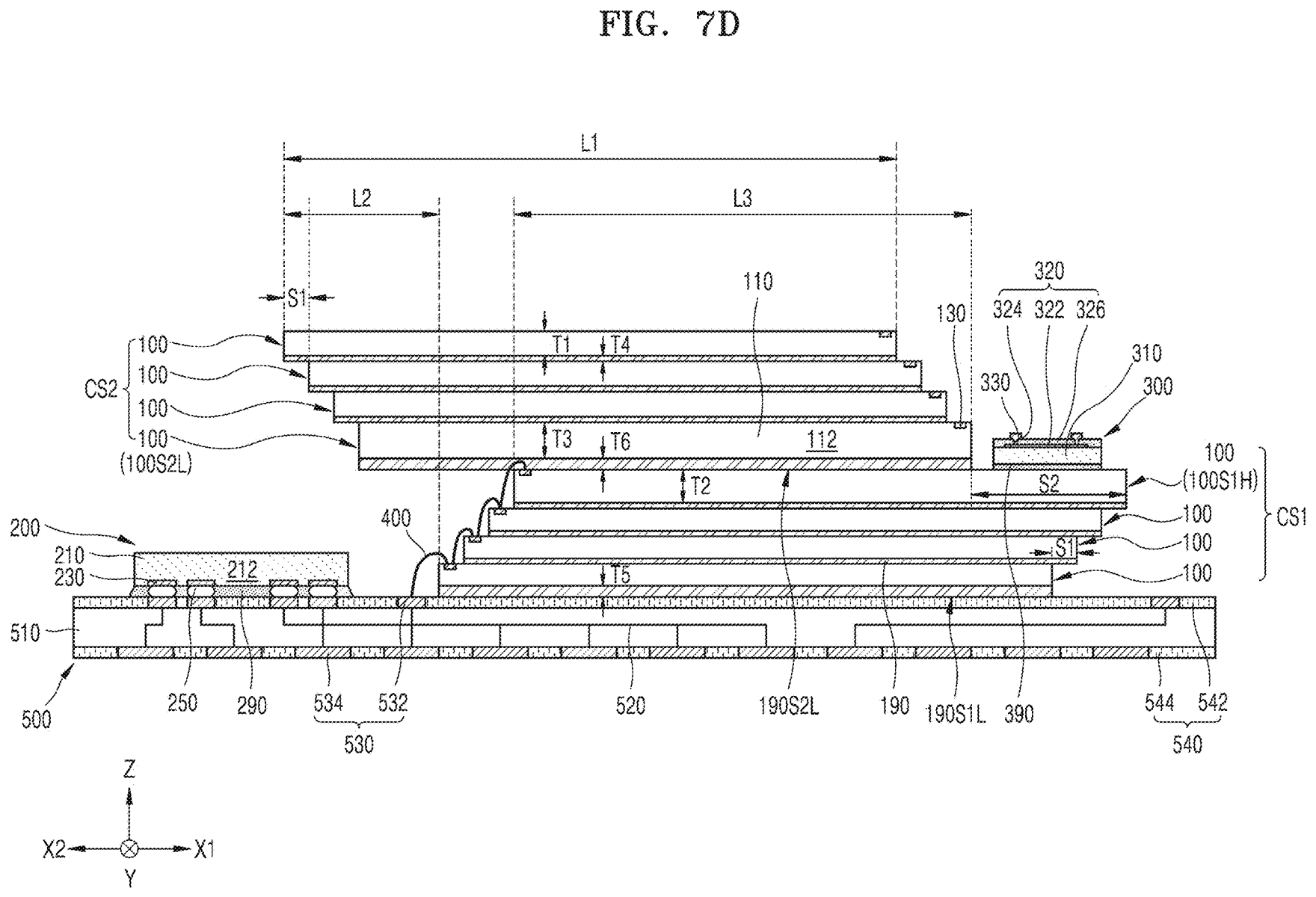

Referring to FIG. 7D, the connection structure 300 is adhered to a portion of the upper surface of the uppermost semiconductor chip 100 of the first chip stack CS1, e.g., the lower support semiconductor chip 100S1H, to which the second chip stack CS2 is not adhered.

Figure 7E:
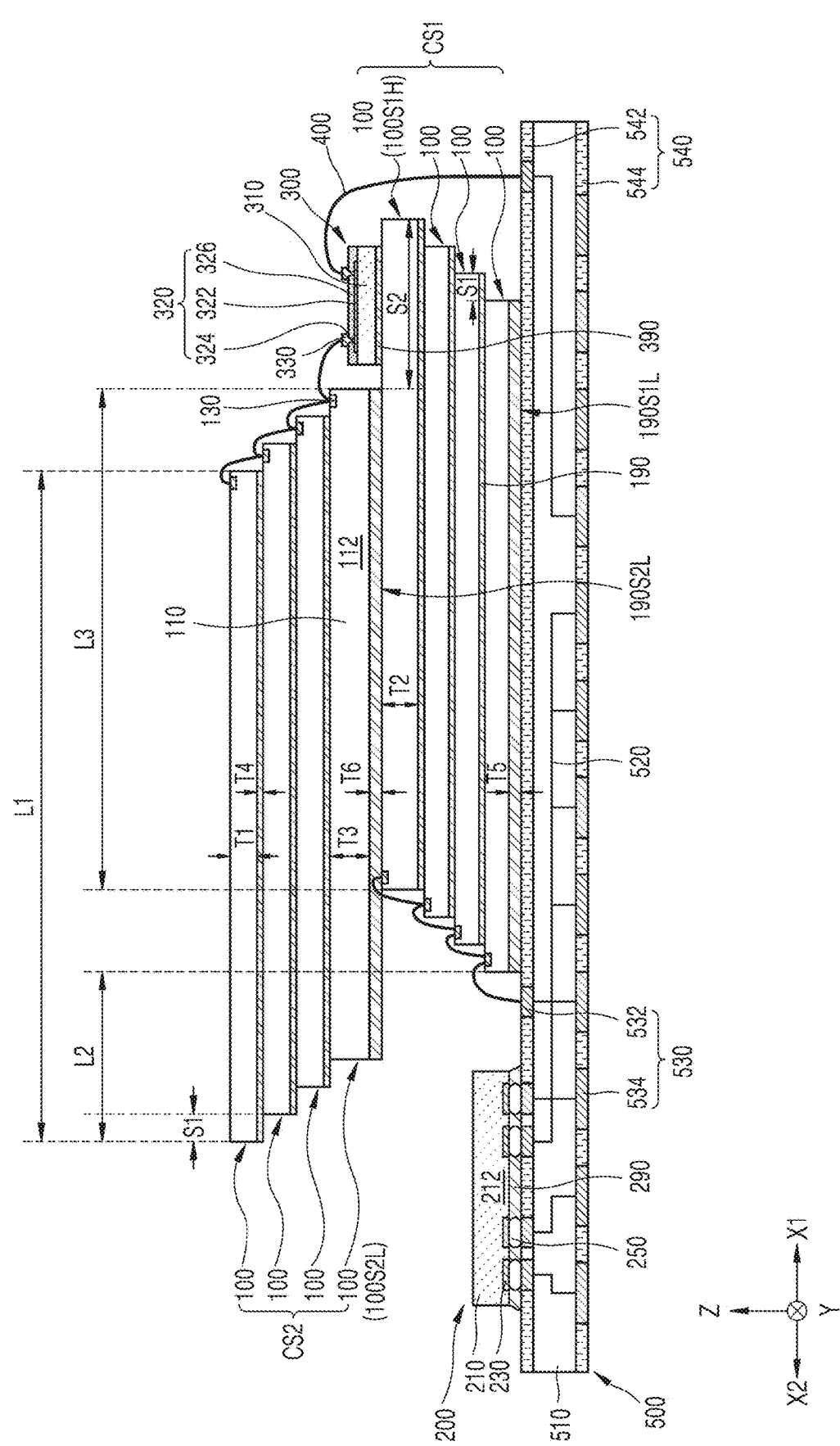

Referring to FIG. 7E, the bonding wires 400 is further formed to sequentially connect the chip pads 130 of each of the semiconductor chips 100 included in the second chip stack CS2, from the chip pads 130 of the uppermost semiconductor chip 100 to the chip pads 130 of the lowermost semiconductor chip 100 of the second chip stack CS2, and to some of the intermediate connection pads 330 of the connection structure 300, and connect some of the plurality of intermediate connection pads 330 of the connection structure and some other ones of the upper connection pads 532.

Thereafter, as shown in FIGS. 1A and 1B, the mold layer 900 covering the upper surface of the package base substrate 500 and surrounding the semiconductor chips 100, the controller chip 200, the connection structure 300, and the bonding wires 400 on the package base substrate 500 may be formed, and the external connection terminals 550 may be adhered to the lower connection pads 534 to form the stacked semiconductor package 1.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While embodiments of inventive concepts have been particularly shown and described with reference to embodiments thereof, it will be understood that various changes in form and details may be made therein without departing from the spirit and scope of the following claims.

What is claimed is:

1. A stacked semiconductor package comprising:
a package base substrate;
a first chip stack shaped as a series of steps, the first chip stack including a plurality of first semiconductor chips stacked sequentially on the package base substrate, each of the plurality of first semiconductor chips being shifted by a first interval in a first horizontal direction;
a second chip stack shaped as a series of steps, the second chip stack including a plurality of second semiconductor chips stacked sequentially on the first chip stack, each of the plurality of second semiconductor chips being shifted by the first interval in a second horizontal direction, the second horizontal direction being opposite the first horizontal direction; and a plurality of bonding wires electrically connecting the plurality of first semiconductor chips and the plurality of second semiconductor chips to the package base substrate, wherein an upper support semiconductor chip is a lowermost second semiconductor chip among the plurality of second semiconductor chips, a lower support semiconductor chip is an uppermost first semiconductor chip among the plurality of first semiconductor chips, the upper support semiconductor chip is shifted from the lower support semiconductor chip by a second interval in the second horizontal direction, the second interval is greater than the first interval.

2. The stacked semiconductor package of claim 1, wherein the plurality of first semiconductor chips each have a first length in the first horizontal direction, the plurality of second semiconductor chips each have the first length in the first horizontal direction, and an uppermost second semiconductor chip among the plurality of second semiconductor chips is shifted by a second length in the second horizontal direction, compared to a lowermost first semiconductor chip among the plurality of first semiconductor chips, and the second length is less than the first length.

3. The stacked semiconductor package of claim 2, wherein a value of the second length is equal to a value of the second interval.

4. The stacked semiconductor package of claim 2, wherein the second length is about 20% to about 60% of the first length.

5. The stacked semiconductor package of claim 2, wherein, in a top view, the upper support semiconductor chip and the lower support semiconductor chip overlap by a third length in the first horizontal direction, and the third length is about 30% to 80% of the first length.

6. The stacked semiconductor package of claim 1, further comprising:

a controller chip adhered to the package base substrate, wherein the controller chip is apart from the first chip stack in the first horizontal direction, and the second chip stack overlaps at least a portion of the controller chip in a vertical direction.

7. The stacked semiconductor package of claim 6, wherein one end of all of the plurality of second semiconductor chips protrudes in the second horizontal direction relative to one end of a lowermost first semiconductor chip among the plurality of first semiconductor chips.

8. The stacked semiconductor package of claim 1, further comprising:

a connection structure adhered to a portion of an upper surface of the lower support semiconductor chip, wherein the upper support semiconductor chip is not adhered to the portion of the upper surface of the lower support semiconductor chip, an upper surface of the connection structure includes a plurality of intermediate connection pads, and the plurality of second semiconductor chips are electrically connected to the package base substrate through the connection structure.

9. The stacked semiconductor package of claim 8, wherein an upper surface of the package base substrate includes a plurality of upper connection pads, upper surfaces of the plurality of first semiconductor chips and upper surfaces of the plurality of second semiconductor chips each include a plurality of chip pads;

the plurality of bonding wires connect the plurality of chip pads of the plurality of first semiconductor chips to some of the plurality of upper connection pads, the plurality of chip pads of the plurality of second semiconductor chips to some of the plurality of intermediate connection pads, and other ones of the plurality of intermediate connection pads to other ones of the plurality of upper connection pads.

10. The stacked semiconductor package of claim 8, wherein the connection structure includes an interposer, a buffer chip, a film substrate, or a redistribution structure.

11. The stacked semiconductor package of claim 1, wherein the plurality of first semiconductor chips include the lower support semiconductor chip and other first semiconductor chips, the plurality of second semiconductor chips include the upper support semiconductor chip and other second semiconductor chips, a thickness of the lower support semiconductor chip is greater than thicknesses of the other first semiconductor chips, and a thickness of the upper support semiconductor chip, is thicker than thicknesses of other second semiconductor chips.

12. A stacked semiconductor package comprising:

a package base substrate;

a first chip stack shaped as a series of steps, the first chip stack including a plurality of first semiconductor chips stacked sequentially on the package base substrate, each of the plurality of first semiconductor chips being shifted by a first interval in a first horizontal direction, and each of the plurality of first semiconductor chips having a first length in the first horizontal direction;

a controller chip adhered to the package base substrate, the controller chip being apart from the first chip stack in the first horizontal direction; and a second chip stack shaped as a series of steps, the second chip stack including a plurality of second semiconductor chips stacked sequentially on the first chip stack, each of the plurality of second semiconductor chips being shifted by the first interval in a second horizontal direction, each of the plurality of second semiconductor chips having the first length in the first horizontal direction, the second horizontal direction being opposite the first horizontal direction, and the second chip stack overlapping at least a portion of the controller chip, wherein a lowermost second semiconductor chip, among the plurality of second semiconductor chips, is shifted by a second interval in the second horizontal direction compared to an uppermost first semiconductor chip among the plurality of first semiconductor chips, the second interval is greater than the first interval, an uppermost second semiconductor chip, among the plurality of second semiconductor chips, is shifted by a second length in the second horizontal direction compared to a lowermost first semiconductor chip among the plurality of first semiconductor chips, and the second length is less than the first length.

13. The stacked semiconductor package of claim 12, wherein the plurality of first semiconductor chips includes the uppermost first semiconductor chip and other first semiconductor chips, the plurality of second semiconductor chips includes the lowermost second semiconductor chip and other second semiconductor chips, the other first semiconductor chips and the other second semiconductor chips each have a first thickness, the uppermost first semiconductor chip and the lowermost second semiconductor chip each have a second thickness, and the second thickness is greater than the first thickness.

14. The stacked semiconductor package of claim 12, further comprising:

a plurality of die adhesive films adhered to lower surfaces of the plurality of first semiconductor chips and lower surfaces of the plurality of second semiconductor chips, respectively, wherein the plurality of die adhesive films include a die adhesive film adhered to a lower surface of the lowermost first semiconductor chip, a die adhesive film adhered to a lower surface of the lowermost second semiconductor chip, and other die adhesive films, a thickness of the die adhesive film adhered to the lower surface of the lowermost first semiconductor chip and a thickness of the die adhesive film adhered to the lower surface of the lowermost second semiconductor chip are greater than thicknesses of the other die adhesive films.

15. The stacked semiconductor package of claim 14, further comprising:

a connection structure adhered to a portion of an upper surface of the uppermost first semiconductor chip, wherein an upper surface of the package base substrate includes a plurality of upper connection pads, and upper surfaces of the plurality of first semiconductor chips and upper surfaces of the plurality of second semiconductor chips each include a plurality of chip pads;

the lowermost second semiconductor chip is not adhered to the portion of the upper surface of the uppermost first semiconductor chip, an upper surface of the connection structure includes a plurality of intermediate connection pads; and a plurality of bonding wires connecting the plurality of chip pads of the plurality of first semiconductor chips to some the plurality of upper connection pads, the plurality of chip pads of the plurality of second semiconductor chips to some the plurality of intermediate connection pads, and other ones of the plurality of intermediate connection pads to other ones of the plurality of upper connection pads.

16. The stacked semiconductor package of claim 15, wherein portions of the plurality of bonding wires connected to the plurality of chip pads of the uppermost first semiconductor chip of the first chip stack are buried in the die adhesive film adhered to a lower surface of the lowermost second semiconductor chip.

17. The stacked semiconductor package of claim 12, wherein a vertical level of an upper surface of the controller chip is lower than a vertical level of an upper surface of the uppermost first semiconductor chip.

18. A stacked semiconductor package comprising:
a package base substrate;

26 a first chip stack shaped as a series of steps, the first chip stack including a plurality of first semiconductor chips stacked sequentially on the package base substrate, each of the plurality of first semiconductor chips being shifted by a first interval in a first horizontal direction;

a controller chip adhered to the package base substrate, the controller chip being apart from the first chip stack in the first horizontal direction;

a second chip stack shaped as a series of steps, the second chip stack including a plurality of second semiconductor chips stacked sequentially on the first chip stack, each of the plurality of second semiconductor chips being shifted by the first interval in a second horizontal direction, the second horizontal direction being opposite the first horizontal direction, the second chip stack overlapping at least a portion of the controller chip;

a connection structure adhered to a portion of an upper surface of an uppermost first semiconductor chip among the plurality of first semiconductor chips, the connection structure electrically connecting the plurality of second semiconductor chips to the package base substrate; and a plurality of bonding wires electrically connecting the plurality of first semiconductor chips and the plurality of second semiconductor chips to the package base substrate, wherein a lowermost second semiconductor chip, among the plurality of second semiconductor chips, is not adhered to the portion of the upper surface of the uppermost first semiconductor chip, the lowermost second semiconductor chip is shifted by a second interval in the second horizontal direction compared to an uppermost first semiconductor chip, among the plurality of first semiconductor chips, the second interval is greater than the first interval, the plurality of first semiconductor chips include the uppermost first semiconductor chip and other first semiconductor chips, the plurality of second semiconductor chips include the uppermost first semiconductor chip and other first semiconductor chips, the other first semiconductor chips each have a first thickness, the uppermost first semiconductor chip has a second thickness, the second thickness is greater than the first thickness, the lowermost second semiconductor chip has a third thickness, and the third thickness is greater than the first thickness and equal to or greater than the second thickness.

19. The stacked semiconductor package of claim 18, wherein an uppermost second semiconductor chip, among the plurality of second semiconductor chips, is shifted in the second horizontal direction by about 20% to about 60% of a length of each of the plurality of first semiconductor chips, compared to a lowermost first semiconductor chip, among the plurality of first semiconductor chips.

20. The stacked semiconductor package of claim 18, wherein the first thickness is about 40 $\mu$m to 80 $\mu$m, the second thickness is about 60 $\mu$m to about 100 $\mu$m, and the third thickness is about 60 $\mu$m to about 150 $\mu$m.

* * * * *